(12) United States Patent  
Huang et al.

(10) Patent No.: US 11,778,914 B2  
(45) Date of Patent: Oct. 3, 2023

(54) ORGANIC GATE TFT-TYPE STRESS SENSORS AND METHOD OF MAKING AND USING THE SAME

(71) Applicant: Taiwan Semiconductor Manufacturing Company Limited, Hsinchu (TW)

(72) Inventors: Rainer Yen-Chieh Huang, Hsinchu (TW); Hai-Ching Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 212 days.

(21) Appl. No.: 17/237,176

(22) Filed: Apr. 22, 2021

(65) Prior Publication Data

US 2022/0344570 A1 Oct. 27, 2022

(51) Int. Cl.
| | |
|---|---|
| *H10N 30/30* | (2023.01) |
| *H01L 29/417* | (2006.01) |
| *H10N 30/071* | (2023.01) |
| *H10N 30/87* | (2023.01) |
| *H01L 29/786* | (2006.01) |
| *H10N 30/50* | (2023.01) |

(Continued)

(52) U.S. Cl.
CPC ..... *H10N 30/302* (2023.02); *H01L 29/41733* (2013.01); *H01L 29/78696* (2013.01); *H10N 30/071* (2023.02); *H10N 30/098* (2023.02); *H10N 30/50* (2023.02); *H10N 30/871* (2023.02); *G01L 1/16* (2013.01)

(58) Field of Classification Search
CPC .......... H01L 41/1132; H01L 29/41733; H01L 29/78696; H01L 41/0471; H01L 41/083; H01L 41/311; H01L 41/45; G01L 1/16; H10N 30/302; H10N 30/071; H10N 30/098; H10N 30/50; H10N 30/871
See application file for complete search history.

(56) References Cited

U.S. PATENT DOCUMENTS 9,212,895 B2 * 12/2015 Suzuki ............... G01B 7/18  
2009/0127977 A1 * 5/2009 So ................... H01L 29/4908  
310/322

(Continued)

FOREIGN PATENT DOCUMENTS

WO WO-2017065306 A1 * 4/2017

*Primary Examiner* — David Vu  
*Assistant Examiner* — Brandon C Fox  
(74) *Attorney, Agent, or Firm* — The Marbury Law Group, PLLC

(57) ABSTRACT

A thin-film transistor may include an amorphous semiconductor channel layer, an organic material piezoelectric stress gate layer formed adjacent to the amorphous semiconductor channel layer, a source electrode coupled to the organic material piezoelectric stress gate layer, a drain electrode coupled to the organic material piezoelectric stress gate layer and a gate electrode coupled to the organic material piezoelectric stress gate layer. In some embodiments, the amorphous semiconductor channel layer may be amorphous indium gallium zinc oxide. In some embodiments, the organic material piezoelectric stress gate layer may be organic polyvinylidene fluoride. In some embodiments, the amorphous semiconductor channel layer may be formed on a flexible substrate.

20 Claims, 12 Drawing Sheets

(51) Int. Cl.
*H10N 30/098* (2023.01)
*G01L 1/16* (2006.01)

(56) References Cited

U.S. PATENT DOCUMENTS

| | | | |
|---|---|---|---|
| 2011/0049579 A1* | 3/2011 | Dumitru | B82Y 10/00 |
| | | | 977/762 |
| 2014/0060210 A1* | 3/2014 | Jeon | G01L 1/16 |
| | | | 73/862.68 |
| 2017/0345653 A1* | 11/2017 | Nishimura | C03C 17/245 |
| 2019/0058106 A1* | 2/2019 | Meng | H01L 29/84 |
| 2020/0083258 A1* | 3/2020 | Fang | H01L 29/41733 |

* cited by examiner

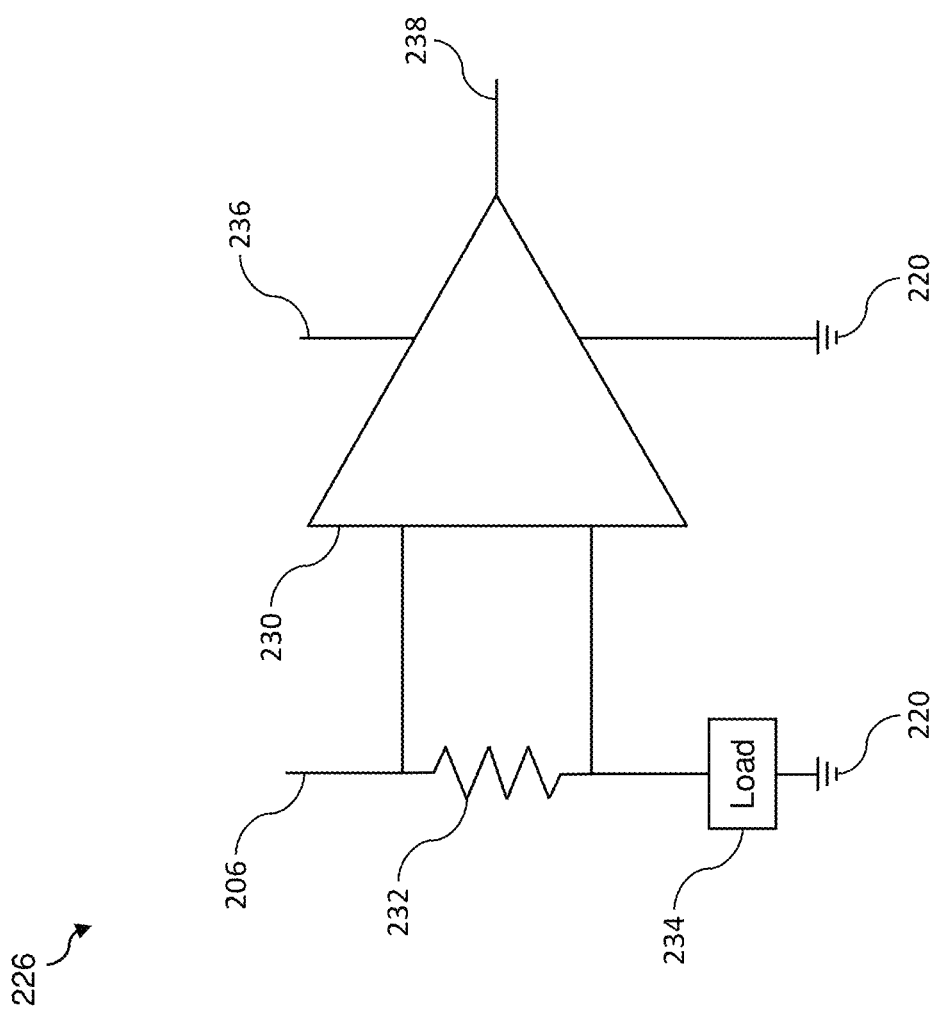

ORGANIC GATE TFT-TYPE STRESS SENSORS AND METHOD OF MAKING AND USING THE SAME

BACKGROUND

Thin-film transistors (TFTs) are useful as sensors in a variety of applications, such as stress or pressure sensors. However, not all TFTs are suitable sensors for all applications. TFTs comprising in-organic high-k dielectrics (e.g., $HfO_2$, $ZrO_2$) with a wafer silicon (Si) channel are inflexible and the stress sensitivity is not well suited for applications involving the human body. Further, the Si channel cannot be used for large-area fabrication, needing to be cut into small chips for stress sensor applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is circuit diagram illustrating an electric voltage or current sensor suitable for implementing various embodiments.

DETAILED DESCRIPTION

Figure 1A:
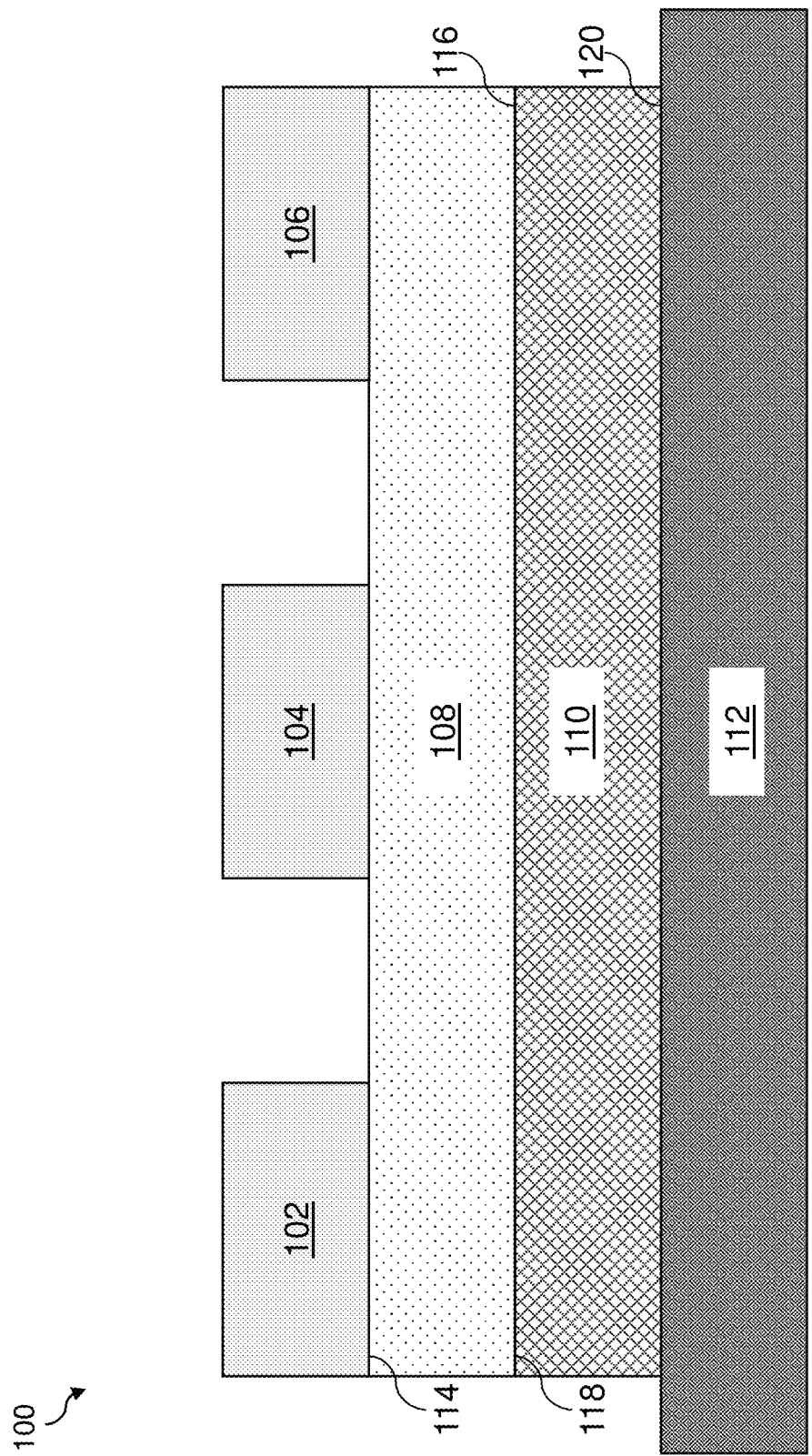
FIG. 1A is a block diagram illustrating a vertical cross-sectional view of a structure after formation of a thin-film transistor (TFT) having a flexible substrate, an amorphous semiconductor channel layer, and an organic material piezoelectric stress gate layer suitable for implementing various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

The terms "processor," "processor core," "controller," and "control unit" are used interchangeably herein, unless otherwise noted, to refer to any one or all of a software-configured processor, a hardware-configured processor, a general purpose processor, a dedicated purpose processor, a single-core processor, a homogeneous multi-core processor, a heterogeneous multi-core processor, a core of a multi-core processor, a microprocessor, a central processing unit (CPU), a graphics processing unit (GPU), a digital signal processor (DSP), etc., a controller, a microcontroller, a field programmable gate array (FPGA), an application-specific integrated circuit (ASIC), other programmable logic devices, discrete gate logic, transistor logic, and the like. A processor may be an integrated circuit, which may be configured such that the components of the integrated circuit reside on a single piece of semiconductor material, such as silicon.

Various embodiments described herein may include devices for organic gate thin-film transistor (TFT)-type stress sensors, methods of forming such devices, and methods of use of such devices. Various embodiments may include a TFT-type stress sensor, or TFT stress sensor, which may include a flexible substrate, an amorphous semiconductor channel layer, and an organic material piezoelectric stress gate layer. In some embodiments, the amorphous semiconductor channel layer may be an amorphous indium gallium zinc oxide (a-IGZO) channel layer. In some embodiments, the organic material piezoelectric stress gate layer may be organic polyvinylidene fluoride (PVDF). In some embodiments, the flexible substrate may be a polymer. In some embodiments, the TFT stress sensor may be embedded in a sheet, such as a blanket or a polymer sheet.

Various embodiments may include forming TFT stress sensor by forming the amorphous semiconductor channel layer on the flexible substrate, and forming the organic material piezoelectric stress gate layer on the amorphous semiconductor channel layer. Some embodiments may further include embedding the TFT stress sensor in a sheet, such as a blanket or a polymer sheet.

Various embodiments may include determining a mechanical stress on the TFT stress sensor using a sensing current at a source electrode of a TFT based on a variable gate voltage applied to a gate electrode of the TFT to achieve a set drain current level. Various embodiments may include determining a mechanical stress on the TFT stress sensor using a sensing current at a source electrode of a TFT based on a set gate voltage applied to the gate electrode of the TFT and a variable drain current output at the drain electrode of the TFT.

Conventional TFT stress sensors, comprising inorganic high-k dielectrics (e.g., $HfO_2$, $ZrO_2$) with a wafer silicon (Si) channel are inflexible. As a result, the stress sensitivity is not well suited for applications involving the human body. Further, the Si channel cannot be used for large-area fabrication. Rather such devices that include a Si channel are typically cut into small chips for stress sensor applications. These limitations make conventional TFT stress sensors suited for application to rigid materials and small areas, like finger-touch sensors, but ill-suited for applications requiring large areas of sensor coverage and greater flexibility.

Various embodiment TFT stress sensors described herein address the foregoing issues of conventional TFT stress sensors by providing for TFT stress sensors that include a flexible substrate, an amorphous semiconductor channel layer, and an organic material piezoelectric stress gate layer. Various embodiment TFT stress sensors, formed using these materials, may allow for greater flexibility, as well as improved stress sensing contact area, and increased stress sensing sensitivity. The greater flexibility may also allow for greater durability of the TFT stress sensors in applications where the rigidity of the conventional TFT stress sensors may make the conventional TFT stress sensors susceptible to breakage.

For example, various embodiment TFT stress sensors may be embedded in a sheet, such as blanket or polymer sheet, which may be placed between a pliable surface, such as a mattress or a cushion, and a subject, such as a human or animal, to sense movement of the subject. Various embodiment TFT stress sensors may be used for patient health care to detect and monitor the subject's movement, which may be associated with the subject's mobility, comfort, consciousness, vitality, etc. For example, during a human subject's sleep, the human subject may be expected to turn-over 20 to 30 times per night. Sensing fewer or more movements than the expected number may indicate a problem with the human subject's sleep patterns. The greater flexibility of various embodiment TFT stress sensors may provide greater comfort to the subject than conventional TFT stress sensors as the embodiment TFT stress sensors may more readily conform to the contours of the pliable surface and body of the subject. The greater flexibility of the embodiment TFT stress sensors may also provide greater durability than conventional TFT stress sensors under the weight of the subject and flexion of the pliable surface. The improved stress sensing contact area and stress sensing sensitivity may provide for sensing of stresses spread over the TFT stress sensors to sense movements of varying degree of any part of the subject that conventional TFT stress sensors may not be able to sense.

FIG. 1A illustrates a vertical cross-sectional view of a structure after formation of a thin-film transistor (TFT) 100. Referring to FIG. 1A, the TFT 100 may include a flexible substrate 112, an amorphous semiconductor channel layer 110, and an organic material piezoelectric stress gate layer 108 suitable for implementing various embodiments. The TFT 100 may also include a source electrode 102, a gate electrode 104, and a drain electrode 106. The example illustrated in FIG. 1A and described herein is an example configuration of the TFT 100 and does not limit the scope of the claims and the specification. Other configurations in which the location of the flexible substrate 112, the amorphous semiconductor channel layer 110, the organic material piezoelectric stress gate layer, the source electrode 102, the gate electrode 104, and the drain electrode 106 relative to each other may be suitable for implementing various embodiments. For example, various configurations of the TFT 100 may include the organic material piezoelectric stress gate layer 108 disposed between the amorphous semiconductor channel layer 110 and the gate electrode 104, and various dispositions of the flexible substrate 112, the source electrode 102, and/or the drain electrode 106 such as in a back gated TFT configuration, fin FET configuration or gate-all-around (GAA) configurations.

The flexible substrate 112 may be provided as a structural component for forming a circuit of a plurality of TFTs 100. Each TFT 100 may include a portion of the flexible substrate 112. The flexible substrate 112 may be a polymer material. For example, the flexible substrate 112 may be polyethylene terephthalate (PET), polyethylene (PE), polytrimethylene furandicarboxylate (PTF), polypropylene (PP), polyvinyl chloride (PVC), etc. In some embodiments, the flexible substrate 112 may be sufficiently strong, pliable, and/or elastic to approximately conform to depressions of a pliable surface, such as a mattress or cushion, under a weight of a subject, such as a human or an animal, on top of the flexible substrate 112 and the pliable surface.

The amorphous semiconductor channel layer 110 may be formed on the flexible substrate 112. In some embodiments, amorphous semiconductor channel layer 110 may be formed by atomic layer deposition (ALD) of a material of the amorphous semiconductor channel layer 110 on the flexible substrate 112. In some embodiments, amorphous semiconductor channel layer 110 may be formed by chemical vapor deposition (CVD) of the material of the amorphous semiconductor channel layer 110 on the flexible substrate 112. In some embodiments, amorphous semiconductor channel layer 110 may be formed by physical vapor deposition (PVD) of the material of the amorphous semiconductor channel layer 110 on the flexible substrate 112. In some embodiments, amorphous semiconductor channel layer 110 may be formed by pulsed deposition (PD) of the material of the amorphous semiconductor channel layer 110 on the flexible substrate 112. The amorphous semiconductor channel layer 110 may have a first side 120 abutting the flexible substrate 112 and a second side 118 distal from the first side 120. The amorphous semiconductor channel layer 110 may have sufficiently large area to be the semiconductor channel layer for a plurality of TFTs 100, where each TFT 100 may include a portion of the amorphous semiconductor channel layer 110.

The material of the amorphous semiconductor channel layer 110 may be a material having greater flexibility. The material of the amorphous semiconductor channel layer 110 may maintain approximately uniform electron mobility and structural uniformity over large-area formations. For example, the amorphous semiconductor channel layer 110 may be amorphous Indium-Gallium-Zinc-Oxide (a-IGZO). In some embodiments, the amorphous semiconductor channel layer 110 may be a thin film of IGZO and/or tin doped IGZO (SnIGZO). In some embodiments, the amorphous semiconductor channel layer 110 may be a thin film of low-temperature poly-silicon (poly-Si) and/or silicon germanium (SiGe). In some embodiments, the amorphous semiconductor channel layer 110 may be an III-V semiconductor material (e.g., gallium arsenide (GaAs), GaAsIn and/or an II-VI semiconductor material (e.g., zinc oxide (ZnO), gallium doped zinc oxide (GZO), aluminum doped zinc oxide (AZO), magnesium oxide (MgO), GdO). In some embodiments, the amorphous semiconductor channel layer 110 may be a compound semiconductor, not used for wafer level Si fabrication. The amorphous semiconductor channel layer 110 may be approximately 0.1 nm to approximately 300 nm thick, although thicker or thinner channel layers may be used. In some embodiments the amorphous semiconductor channel layer 110 may be may be thicker than approximately 300 nm, but by being approximately 300 nm or thinner may avoid inducing a current while the TFT 100 is on an off state. Further the amorphous semiconductor channel layer 110 being approximately 300 nm or thinner may have increased flexibility, such as for withstanding curvature or bending, compared to thicker constructions, which may make the approximately 300 nm or thinner constructions more suitable for flexible TFT applications. The amorphous semiconductor channel layer 110 may have a surface area of any size, such as between approximately 1% to greater than 100% of the width of a hospital bed mattress and a length between approximately 1% to greater than 100% of the length of a hospital bed mattress, although larger or smaller surface areas may be used.

The organic material piezoelectric stress gate layer 108 may be formed on the second side 118 of the amorphous semiconductor channel layer 110. The organic material piezoelectric stress gate layer 108 may have a first side 116 abutting the amorphous semiconductor channel layer 110 and a second side 114 distal from the first side 116. The amorphous semiconductor channel layer 110 may have sufficiently large area to be the stress gate layer for a plurality of TFTs 100, where each TFT 100 may include a portion of the organic material piezoelectric stress gate layer 108.

The organic material piezoelectric stress gate layer 108 may be a material having piezoelectric properties. In response to a mechanical stress, the organic material piezoelectric stress gate layer 108 may develop a piezopotential by deformation of the molecular structure of the organic material piezoelectric stress gate layer 108 causing polarization of the molecules of the organic material piezoelectric stress gate layer 108. The piezopotential may result from opposite polarization at the first side 116 and the second side 114 of the organic material piezoelectric stress gate layer 108. In some embodiments, the organic material piezoelectric stress gate layer 108 may be organic polyvinylidene fluoride (PVDF). In some embodiments, the organic material piezoelectric stress gate layer 108 may be organic polyvinylidene fluoride-trifluoroethylene (PVDF-TrFE). In some embodiments, the organic material piezoelectric stress gate layer 108 may be hafnium oxide doped with zirconium (HfZrO). An HfZrO organic material piezoelectric stress gate layer 108 may be approximately 0.1 nm to 100 nm thick, although other thicker or thinner gate layers may be used. An HfZrO organic material piezoelectric stress gate layer 108 may have oxygen vacancy. An HfZrO organic material piezoelectric stress gate layer 108 may have varied Hf:Zr ratios, such that HfZrO may be $Hf_xZr_{1-x}O_y$, for which "x" may be a number from 0 to 1 and "y" may be any positive number. In some embodiments, the organic material piezoelectric stress gate layer 108 may be aluminum nitride (AlN) doped with scandium (Sc) and/or other ferroelectric elements. In some embodiments, the organic material piezoelectric stress gate layer 108 may be barium titanate (BaTiO$_3$), lead titanate (PbTiO$_3$), and/or lead zirconate titanate (Pb(ZrTi)O$_3$, PZT).

The gate electrode 104 may be a metal electrode formed in physical contact with the second side 114 of the organic material piezoelectric stress gate layer 108. The gate electrode 104 may be physically separated from the amorphous semiconductor channel layer 110 by the organic material piezoelectric stress gate layer 108.

The source electrode 102 and the drain electrode 106 may be metal electrodes. In some embodiments the source electrode 102 and the drain electrode 106 may be formed in physical contact with the second side 114 of the organic material piezoelectric stress gate layer 108. The organic material piezoelectric stress gate layer 108 may physically separate the source electrode 102 and the drain electrode 106 from the amorphous semiconductor channel layer 110. In some embodiments, the organic material piezoelectric stress gate layer 108 may include channels (not shown) through which the source electrode 102 and the drain electrode 106 may be formed such that the source electrode 102 and the drain electrode 106 may be in physical contact with the amorphous semiconductor channel layer 110. The source electrode 102 and the drain electrode 106 may be physically separate.

The metal gate electrode 104, source electrode 102 and drain electrode 106 include at least one conductive material, which may be a combination of a metallic liner layer (such as a metallic nitride or a metallic carbide) and a metallic fill material. Each metallic liner layer may include titanium nitride (TiN), tantalum nitride (TaN), tungsten nitride (WN), titanium carbide (TiC), tantalum carbide (TaC), and tungsten carbide (WC), and each metallic fill material portion may include tungsten (W), copper (Cu), aluminum (Al), cobalt (Co), ruthenium (Ru), molybdenum (Mo), tantalum (Ta), titanium (Ti), alloys thereof, and/or combinations thereof. Other suitable conductive materials within the contemplated scope of disclosure may also be used. The gate electrode 104, source electrode 102 and/or drain electrode 106 may be single layer or multi-layer formations. A buffer layer or blocking layer (not shown) may be formed between the gate electrode 104 and the organic material piezoelectric stress gate layer 108. The buffer layer or blocking layer be an adhesive layer or glue layer configured to increase an adhesive ability between the gate electrode 104 and the organic material piezoelectric stress gate layer 108 layer. The buffer layer or blocking layer materials may include tantalum pentoxide (Ta$_2$O$_5$) or hafnium dioxide (HfO$_2$) doped with Si, magnesium (Mg), aluminum (Al), yttrium oxide (Y$_2$O$_3$), lanthanum (La), strontium (Sr), gadolinium (Gd), nitrogen (N), Sc, calcium (Ca), Ti, W, chromium (Cr), Ta, Mo, Ru, osmium (Os), epoxy, etc., or any combination compound of Si, Mg, Al, Y$_2$O$_3$, La, Sr, Gd, N, Sc, Ca, Ti, W, Cr, Ta, Mo, Ru, Os, etc. The buffer layer or blocking layer may have a thickness of between approximately 0.1 nm and approximately 1 nm, although thicker or thinner buffer layers or blocking layers may be used.

Figure 1B:
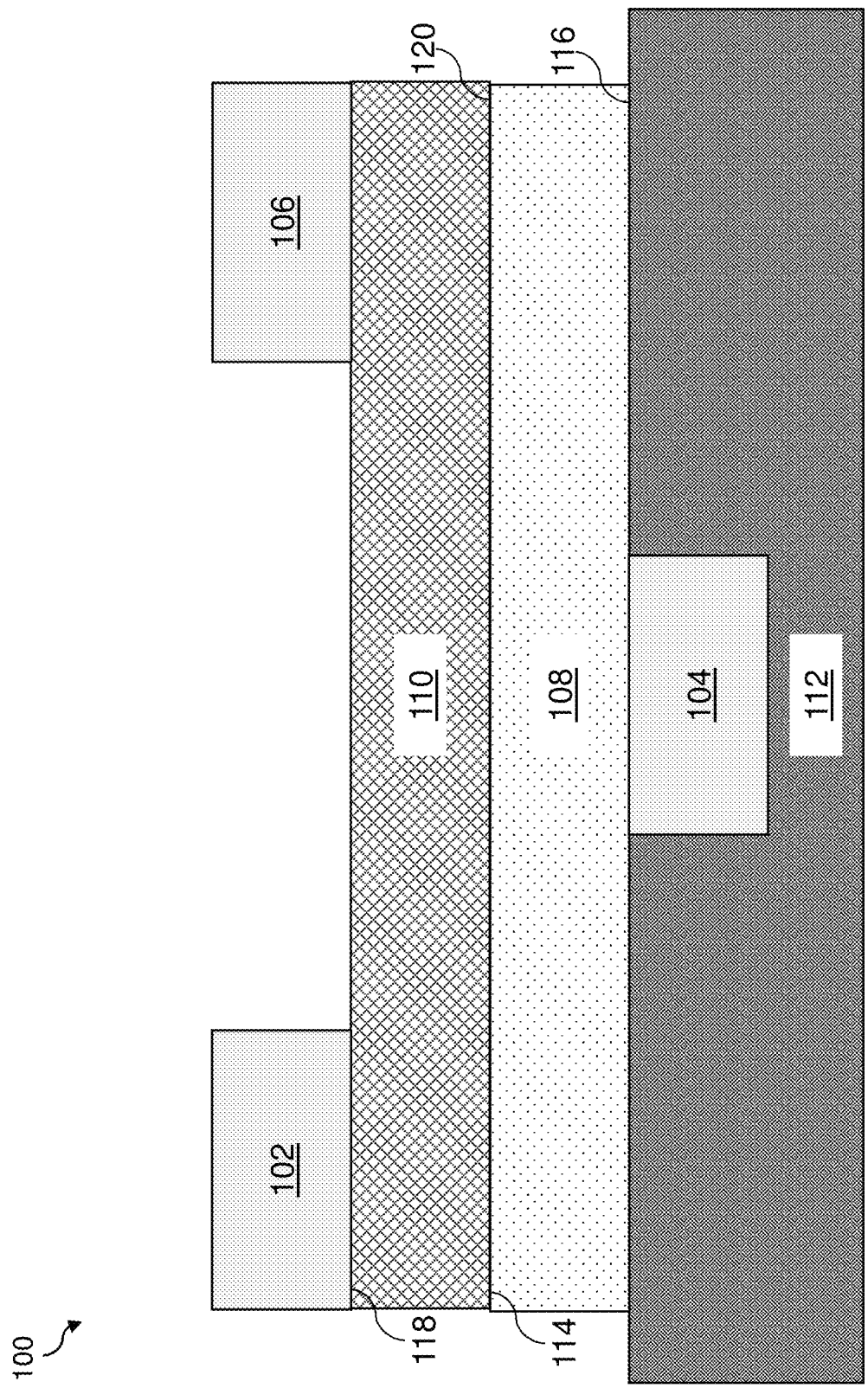
FIG. 1B is a block diagram illustrating a vertical cross-sectional view of an alternative configuration of a structure after formation of a TFT having a flexible substrate, an amorphous semiconductor channel layer, and an organic material piezoelectric stress gate layer suitable for implementing various embodiments.

As noted above, other embodiment configurations may be implemented. For example, FIG. 1B illustrates a back gated TFT in which the gate electrode 104 may be embedded within the substrate 112. The organic material piezoelectric stress gate layer 108 may be formed over the gate electrode 104, such that the first side 116 of the organic material piezoelectric stress gate layer 108 may abut a top surface of the gate electrode 104 and substrate 112. The amorphous semiconductor channel layer 110 may be formed over the organic material piezoelectric stress gate layer 108 such that the first side 120 of the amorphous semiconductor channel layer 110 may abut the second side 114 of the organic material piezoelectric stress gate layer 108. The source electrode 102, and/or the drain electrode 106 may contact the amorphous semiconductor channel layer 110 on a second side 118 of the amorphous semiconductor channel layer 110.

The TFT 100 may be electrically connectable to an electric power source (not shown), such as an electric socket or a battery, from which the source electrode 102 may receive a source voltage or current, and the gate electrode 104 may receive a gate voltage or current. A controller (not shown) may be configured to control the source voltage or current and/or the gate voltage or current, such as via a transformer (not shown) or converter (not shown). In some embodiments, the controller may be a processor (e.g., central processing unit (CPU)), a microcontroller, a programmable logic device (PLD), an application-specific integrated circuit (ASIC), etc.).

In some embodiments, without a sufficient mechanical stress on the organic material piezoelectric stress gate layer 108, the source electrode 102 and the drain electrode 106 may be electrically isolated from each other. The organic material piezoelectric stress gate layer 108 may insulate the amorphous semiconductor channel layer 110 from the field effect of the gate voltage or current applied to the gate electrode 104. The field effect alone may be insufficient to form a conductive channel (not shown) in the amorphous semiconductor channel layer 110 connecting the source electrode 102 and the drain electrode 106. In response to application of a mechanical stress, the organic material piezoelectric stress gate layer 108 may develop a piezopotential resulting from opposite polarization at the first side 116 and the second side 114 of the organic material piezoelectric stress gate layer 108. In some embodiments, polarization at the first side 116 of the organic material piezoelectric stress gate layer 108 may generate a sufficient field effect to from a conductive channel in the amorphous semiconductor channel layer 110. In some embodiments, the field effect of the gate voltage or current applied to the gate electrode 104 in conjunction with the field effect of the polarization at the first side 116 of the organic material piezoelectric stress gate layer 108 may generate a sufficient field effect to from a conductive channel in the amorphous semiconductor channel layer 110. The conductive channel in the amorphous semiconductor channel layer 110 may electrically connect the source electrode 102 and the drain electrode 106, allowing electric current to flow between the source electrode 102 and the drain electrode 106.

In some embodiments, the organic material piezoelectric stress gate layer 108 may not completely electrically insulate the amorphous semiconductor channel layer 110 from the field effect of the gate voltage or current applied to the gate electrode 104. The field effect alone may be sufficient to form a conductive channel in the amorphous semiconductor channel layer 110 connecting the source electrode 102 and the drain electrode 106. However, characteristics, such as resistance, of the conductive channel in the amorphous semiconductor channel layer 110 may be affected by the field effect of the polarization at the first side 116 of the organic material piezoelectric stress gate layer 108.

In some embodiments, the characteristics of the conductive channel in the amorphous semiconductor channel layer 110 may be affected by variances in the magnitude of the field effect forming the conductive channel. For example, the gate voltage or current applied to the gate electrode 104 may be controlled, via the controller, to affect the characteristics of the conductive channel. For another example, the mechanical stress on the organic material piezoelectric stress gate layer 108 may affect the characteristics of the conductive channel. The greater the magnitude of the field effect of the gate voltage or current applied to the gate electrode 104 and/or the mechanical stress on the organic material piezoelectric stress gate layer 108, the greater the affect on the characteristics of the conductive channel in the amorphous semiconductor channel layer 110. For example, increases in the magnitude of field effect of the gate voltage or current applied to the gate electrode 104 and/or the mechanical stress on the organic material piezoelectric stress gate layer 108 may cause decreases in the resistance of the conductive channel in the amorphous semiconductor channel layer 110.

In some embodiments, multiple TFTs 100 may be electrically connected to common electrical conduits (not shown) in a coverage pattern. The coverage pattern may be any organization of the electrically connected TFTs 100, such as a grid pattern, spiral pattern, etc. The common electrical conduit may electrically connect like components of the TFTs 100. For example, the source electrodes 102 of the TFTs 100 may be electrically connected to a source electrical conduit, the gate electrodes 104 of the TFTs 100 may be electrically connected to a gate electrical conduit, and the drain electrodes 106 of the TFTs 100 may be electrically connected to a drain electrical conduit. In some embodiments, multiple of any of the types of the common electrical conduits may electrically connect different groups of the multiple TFTs 100.

Figure 2A:
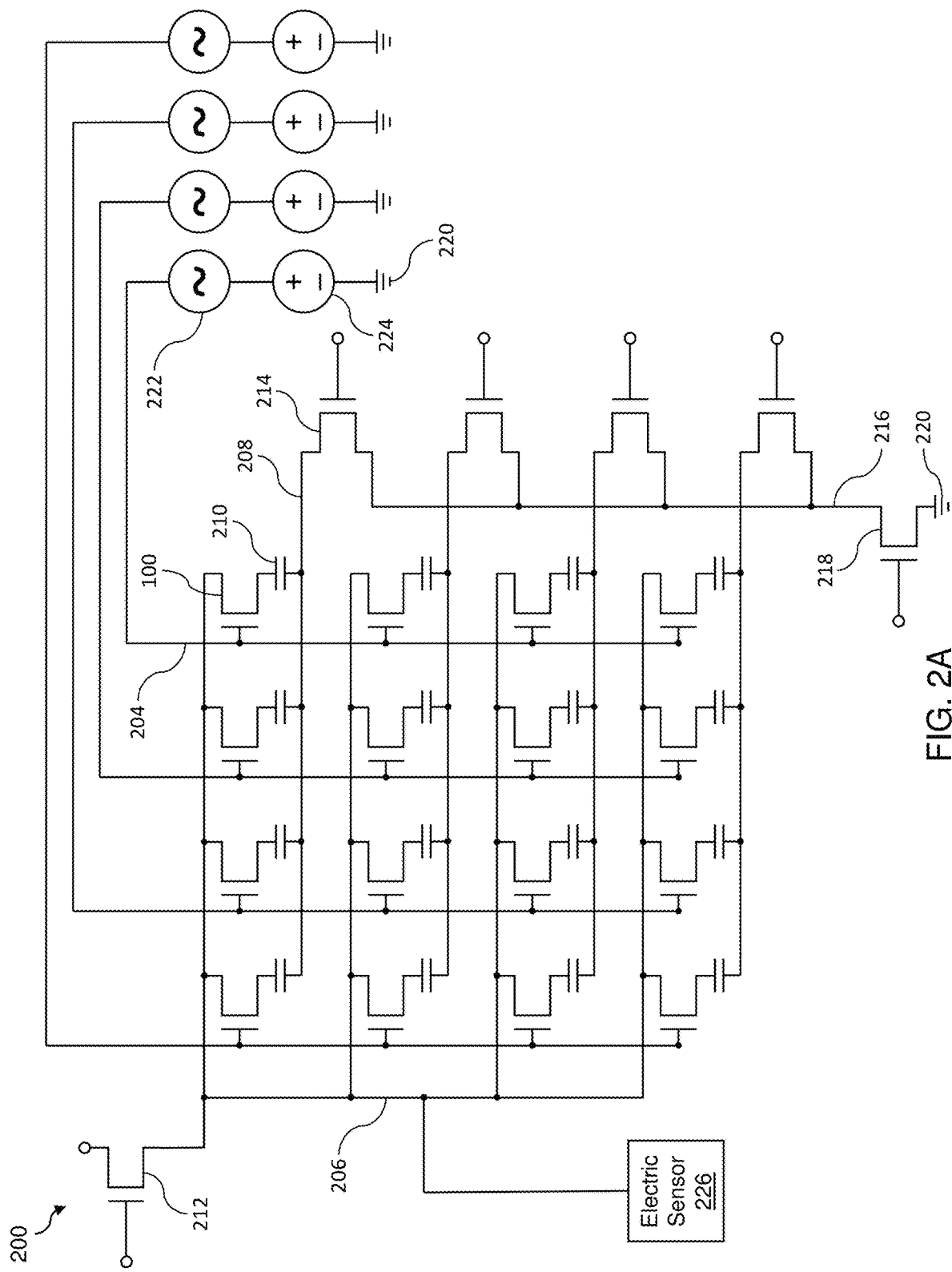
FIG. 2A is circuit diagram illustrating a TFT stress sensor suitable for implementing various embodiments.

FIG. 2A illustrates a circuit diagram of a TFT stress sensor 200 suitable for implementing various embodiments. With reference to FIGS. 1A, 1B and 2A, the TFT stress sensor 200 may include multiple TFTs 100 (e.g., TFT 100 in FIGS. 1A, 1B) and an electric voltage or current sensor (electric sensor) 226. Each TFT 100 may be electrically connected to an electrical conduit 204, 206, 208, 216. Each TFT 100 may also be electrically connected to a capacitor 210 at a drain end (e.g., drain electrode 106 in FIGS. 1A, 1B). The electric sensor 226 may be electrically connected to the TFTs 100 via the electrical conduit 206. In some embodiments, various other transistors 212, 214, 218 may be electrically connected to the electrical conduits 206, 208, 216 to control the electric current or voltage in the TFT stress sensor 200. The TFTs 100 and various other transistors 212, 214, 218 may be controlled by application of electric current or voltage to a source end (e.g., source electrode 102 in FIGS. 1A, 1B) and/or a gate end (e.g., gate electrode 104 in FIGS. 1A, 1B) by a controller (not shown). In some embodiments, the controller may be a processor (e.g., CPU, a microcontroller, a PLD, an ASIC, etc.). The example illustrated in FIG. 2A shows specific numbers of components, such as a number of the TFT stress sensor 200 and the electric sensor 226, that are used for clarity and ease of explanation, but do not limit the scope of the claims or the specification to the numbers of components of the TFT stress sensor 200 or the electric sensor 226 in the example illustrated in FIG. 2A. For example, the TFT stress sensor 200 may include any number of TFTs 100, such as a number of TFTs 100 less than or greater than the sixteen (16) TFTs 100 shown in the example illustrated in FIG. 2A. For another example, the TFT stress sensor 200 may include any number of electric sensors 226, such as a number of electric sensors 226 greater than the one electric sensor 226 shown in the example illustrated in FIG. 2A.

A gate electrical conduit 204 may be electrically coupled to an electric power source 224, such as an electric socket or a battery, from which the gate electrical conduit 204 may receive a gate voltage or current. The gate end of the TFTs 100 may be electrically connected to the gate electrical conduit 204. The TFTs 100 may receive the gate voltage or current at the gate end via the gate electrical conduit 204. A source electrical conduit 206 may be coupled between a drain end of source transistor 212 and the source end of each TFT 100 in the array of TFTs 100. The source end of the source transistor 212 may be coupled to a source voltage to power the array of TFTs 100. In some embodiments, the electric power source 224 may be the same for the source voltage or current and the gate voltage or current. In some embodiments, the electric power source 224 may be different for the source voltage or current and the gate voltage or current. In some embodiments, the electric power source 224 may be different for any number and combination of the gate voltages or currents. The voltage or current from the electric power source 224 may be conditioned by an electric power conditioning component (not shown) to become the source voltage or current and/or gate voltage or current. For example, the voltage or current from the electric power source 224 may be conditioned by an alternating current (AC)/direct current (DC) rectifier (not shown) and/or a DC/DC converter (not shown) to generate the source voltage or current. For another example, the voltage or current from the electric power source 224 may be conditioned by an AC/DC rectifier (not shown), a DC/DC converter (not shown), a DC/AC inverter (not shown), and/or an AC/AC converter (not shown) to generate the gate voltage or current. In some embodiments, the power conditioning of the voltage or current from the electric power source 224 may be performed by a power management integrated circuit (PMIC, not shown).

Receiving the source voltage or current by the TFTs 100 may be controlled by a source transistor 212, which may be configured and controlled to provide the source voltage or current from the electric power source 224 to the source electrical conduit 206. For example, the source transistor 212 may receive the source voltage or current from the electric power conditioning component. The TFTs 100 may receive the gate voltage or current, which may include a bias DC voltage or current and an AC voltage or current, from the electric power source 224 via the gate electrical conduit 204. In some embodiments, the DC voltage or current may be generated by an electric power conditioning component, such as an AC/DC rectifier and/or a DC/DC converter. The AC voltage or current portion of the gate voltage or current may be controlled by an oscillator 222, which may be controlled by the controller. In some embodiments, the oscillator 222 may be an electric power conditioning component, such as the oscillator 222 being or including a DC/AC inverter and/or an AC/AC converter. The bias DC voltage or current may be configured to provide a voltage or current to keep the TFTs 100 in an active mode. The AC voltage or current portion of the gate voltage or current may be configured to activate the TFTs 100 (e.g., affect a conductive channel in an amorphous semiconductor channel layer 110 connecting the source electrode 102 and the drain electrode 106 in FIGS. 1A, 1B) and may vary in magnitude. In some embodiments, the oscillator 222 may be the same for the gate voltages or currents. In some embodiments, the oscillator 222 may be different for any number and combination of the gate voltages or currents.

In response to the formation or change of conductive channels in amorphous semiconductor channel layers (e.g., amorphous semiconductor channel layer 110 in FIGS. 1A, 1B) of the TFTs 100, electric current may flow between the source end 102 and the drain end 106 of the TFTs 100. The magnitude of the electric current may depend on the characteristics, such as resistance, of the conductive channels 110, which may be affected by the gate voltage or current received at the gate end 104 and/or a mechanical stress received by the TFTs 100, and specifically by an organic material piezoelectric stress gate layer (e.g., organic material piezoelectric stress gate layer 108 in FIGS. 1A, 1B). The electric current may be output by the TFTs 100 at the drain end 106.

The electric current through the TFTs 100 may be sensed and referred to herein as a sensing current. For example, the controller may be configured to receive and interpret a signal representing the sensing current. The sensing current may be sensed using various known means. In some embodiments, the signal representing the sensing current may be a voltage signal based on the sensing current sensed at the source end of the TFTs 100 by the electric sensor 226 via the source electrical conduit 206. The TFTs 100 receiving a mechanical stress may output varying drain currents to their respective electrically connected capacitors 210. The capacitors 210 may be rated with a given capacitance allowing the electric current to flow through the TFTs 100 and the sensing current to be sensed at the source electrode of the TFTs 100. The sensing current may be used to determine the sensing current signal to the controller by the electric sensor 226, as described further with reference to FIG. 2B. The controller may determine from the sensing current signal that a mechanical stress is applied to the TFTs 100 to cause the electric current flow through the TFTs 100 and the sensing current at the source 102 of the TFTs 100.

In some embodiments, the controller may be configured to control activation of certain TFTs 100 of the TFT stress sensor 200. The controller may be able to determine whether a mechanical stress is applied to the TFTs based on whether a sensing current is sensed at activated TFT 100. For example, the controller may control which of the TFTs 100 receive the source voltage or current, such as by controlling the source transistor 212. For another example, the controller may control which of the TFTs 100 receive the gate voltage or current configured to activate the TFTs 100, such as by controlling the oscillator 222. The controller may activate TFTs 100 that receive both the source voltage or current and the gate voltage or current. In some embodiments, the TFTs 100 may be organized in rows and columns. The controller may be configured to activate a row and/or a column of TFTs 100 to determine whether the activated TFTs 100 are experiencing a mechanical stress. For example, the controller may provide the gate voltage or current to a particular column of TFTs 100 and provide the source voltage or current to multiple rows of TFTs 100. For another example, the controller may provide the source voltage or current to a particular row of TFTs 100 and provide the gate voltage or current to multiple columns of TFTs 100. For another example, the controller may provide the gate voltage or current to a particular column of TFTs 100 and provide the source voltage or current to a particular row of TFTs 100. The combination of the column(s) and the row(s) of TFT(s) 100 receiving the gate voltage or current and the source voltage or current may indicate an address or location of the activated TFTs 100. The controller may determine the address or location of the activated TFTs 100 for which the controller receives or senses a sensing current signal to determine the address or location of the mechanical stress within the TFT stress sensor 200.

A drain electrical conduit 208 may be electrically connected to the TFTs 100 at the drain end. For example, the drain electrical conduit 208 may be electrically connected to at the drain end of the TFTs 100 via the capacitor 210. The capacitor 210 may build up and output the drain current to the drain electrical conduit 208.

An output transistor 214 may be electrically connected at a source end to the drain electrical conduit 208 and to an output electrical conduit 216 at a drain end. The controller may be configured to apply a gate current or voltage to control activation of the output transistor 214 to electrically connect the drain electrical conduit 208 and the output electrical conduit 216. In some embodiments, the controller may control which output transistor 214 to activate to control which capacitors 210 to discharge. For example, the controller may be configured to control discharge of the capacitors 210 once the activated electrically connected TFTs 100 have been deactivated. The electric sensor 226 may sense the sensing current for the activated TFTs 100. Once the TFTs 100 are deactivated, the electric sensor 226 may no longer sense the sensing current for the same TFTs 100, at which point it may not be necessary to retain the drain current built up in the capacitors 210.

A discharge transistor 218 may be electrically connected at a source end to the output electrical conduit 216 and electrically connectable at a drain end to a ground 220. The controller may control a gate voltage or current provided to the discharge transistor 218 to electrically connect the output electrical conduit 216 and the ground 220. The capacitors 210 may discharge by being electrically connected to the ground 220. The capacitors 210 may be electrically connected to the ground 220 by the controller activating the output transistor(s) 214 and the discharge transistor 218.

FIG. 2B illustrates an electric sensor 226 suitable for implementing various embodiments. With reference to FIGS. 1A-2B, the electric sensor 226 may include an operational amplifier 230 and a resistor 232. The electric sensor 226 may be electrically coupled to the source electrodes 102 via electrical conduit 206 at a first end of the resistor 232 and at a first input of the operational amplifier 230 and to a reference load (load) 234 at a second end of the resistor and a second input of the operational amplifier 230. The operational amplifier 230 may be electrically coupled to an electric power supply 236, which may receive electric power from an electric power source (e.g., electric power source 224 in FIG. 2A) at an electrical power input. The operational amplifier 230 may be electrically coupled to a ground 220 at an electrical power output. The operational amplifier 230 may receive the sensing current at the source end (e.g., source electrode 102 in FIGS. 1A, 1B) of activated TFTs (e.g., TFT 100 in FIGS. 1A, 1B, 2A) via the source electrical conduit 206. The operational amplifier 230 may sense the voltage differential between the sensing current and the reference load 234, and amplify the voltage differential to generate an amplified voltage as the sensing current signal 238, which may be received by the controller (not shown). For example, the operational amplifier 230 may multiply the sensing current, the resistance of the resistor 232, and a gain of the operational amplifier 230 to generate the amplified voltage.

Figure 3:
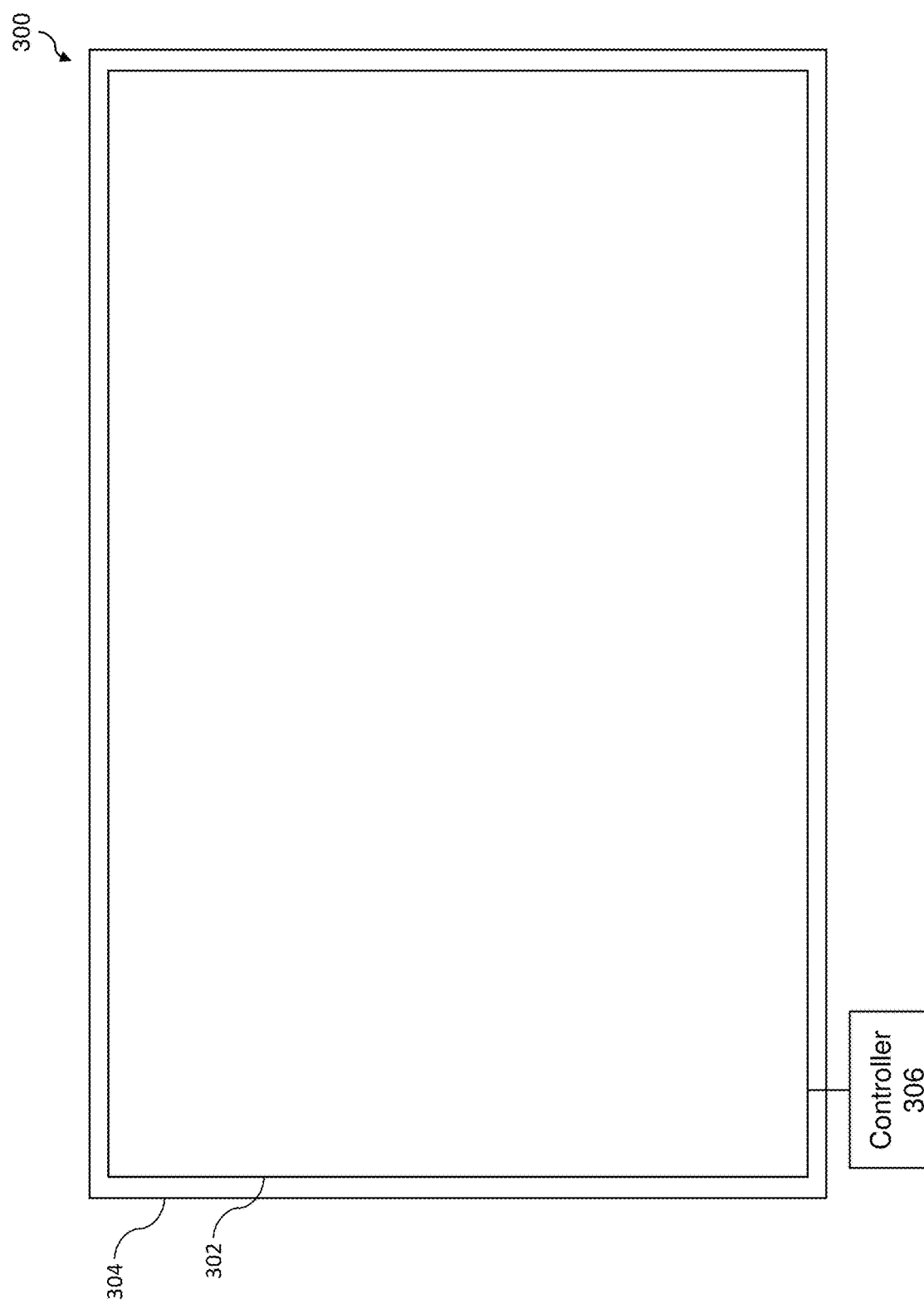
FIG. 3 is block diagram illustrating a TFT stress sensor device suitable for implementing various embodiments.
Figure 4:
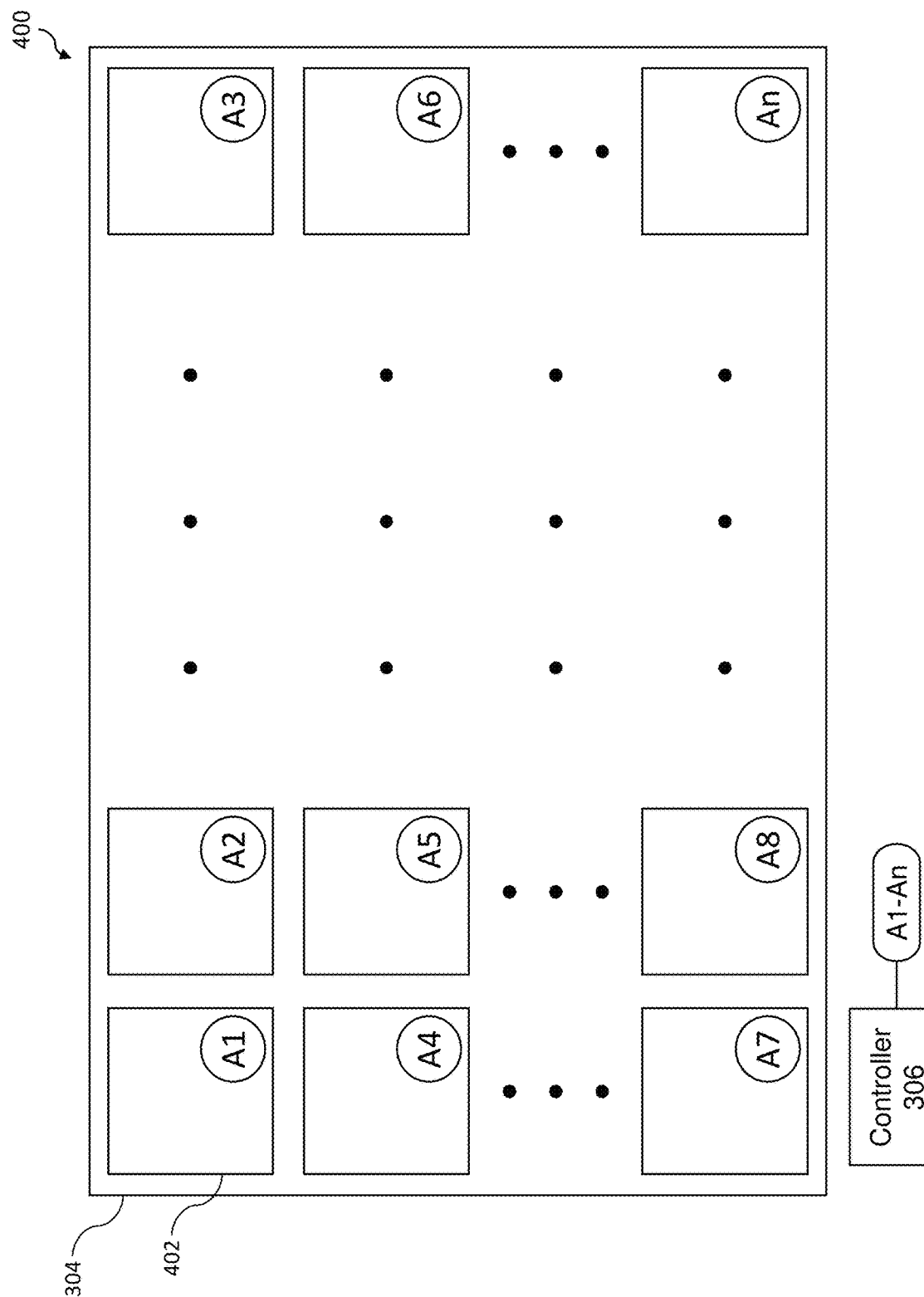
FIG. 4 is block diagram illustrating a TFT stress sensor device suitable for implementing various embodiments.

FIGS. 3 and 4 illustrate TFT stress sensor devices 300, 400 suitable for implementing various embodiments. With reference to FIGS. 1A-4, a TFT stress sensor device 300, 400 may include any number and combinations of TFT stress sensors 302, 402 (e.g., TFT stress sensor 200 in FIG. 2A) embedded in a sheet 304, such as a blanket or a polymer sheet. The TFT stress sensors 302, 402 may include any number and combination of TFTs (not shown; e.g., TFT 100 in FIGS. 1A-2A). For example, the TFT stress sensor device 300 may include a single TFT stress sensor 302. For another example, the TFT stress sensor device 400 may include multiple TFT stress sensors 402 arranged in any pattern, such as tiles, strips, etc. The TFT stress sensor device 300, 400 may include any number and combination of controllers 306 wired and/or wirelessly communicatively connected (e.g., A1-An illustrated in FIG. 4) to the TFT stress sensors 302, 402. The controller 306 may be a processor (e.g., CPU, a microcontroller, a PLD, an ASIC, etc.). In various embodiments, the TFT stress sensors 302, 402 may be embedded in the sheet 304 by being sewn to the sheet 304, welded (e.g., via ultrasonic welding) to the sheet 304, adhered or bonded to the sheet 304, impressed into the sheet 304, encased in the to the sheet 304, etc. In some embodiments, the TFT stress sensors 302, 402 may be of a cumulative area approximately equal to the area of the sheet 304. In some embodiments, the TFT stress sensors 302, 402 may be of a cumulative area configured to be approximately equal to a surface (not shown; e.g., a mattress or a cushion) over which the sheet 304 may be placed. In some embodiments, the TFT stress sensors 302, 402 may be of a cumulative area and/or pattern configuration configured to detect movement of a subject (e.g., a human or an animal) on the sheet 304.

Figure 5:
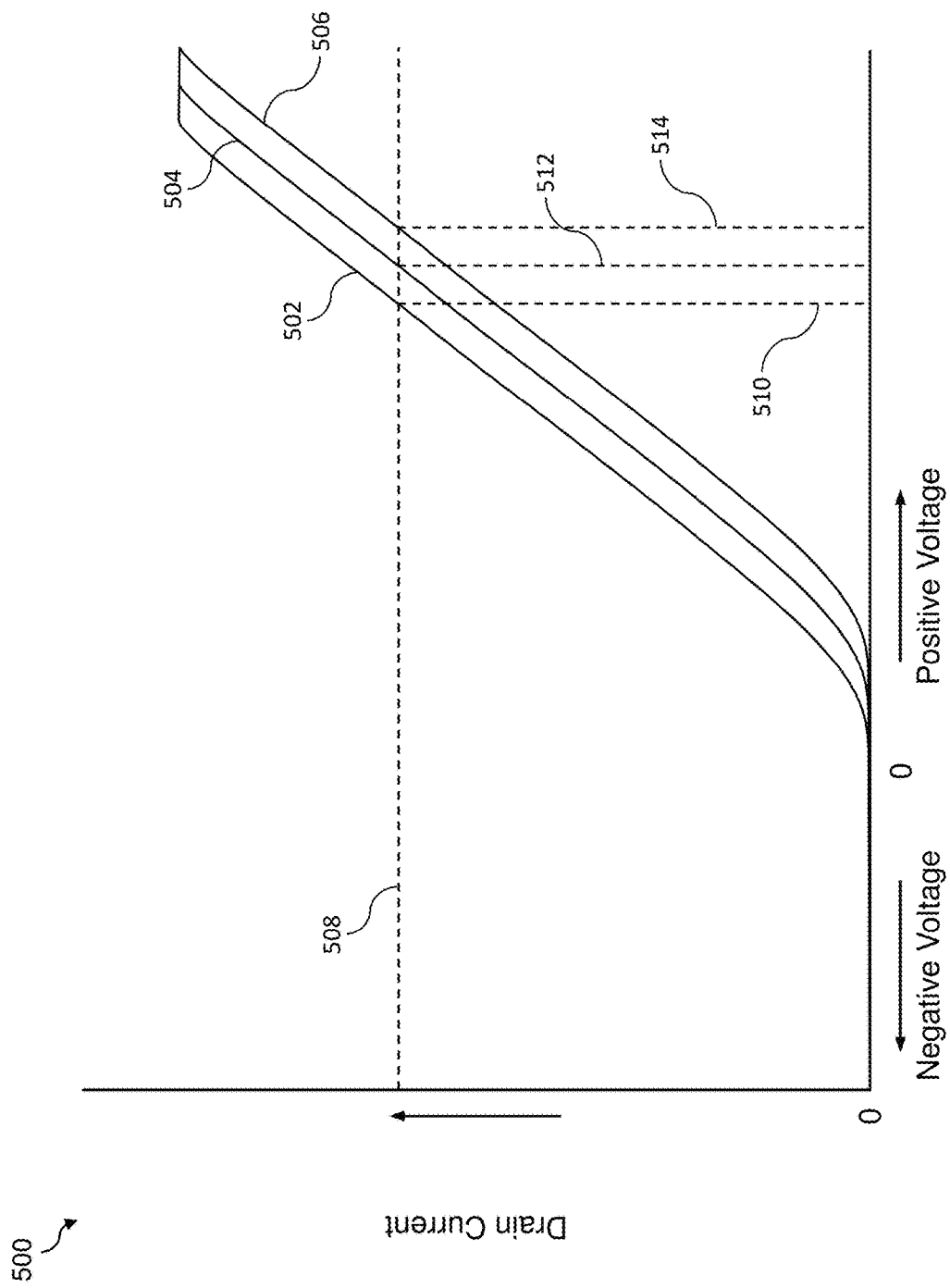
FIG. 5 is a graph diagram illustrating electric current and voltage of a TFT according to an embodiment.
Figure 6:
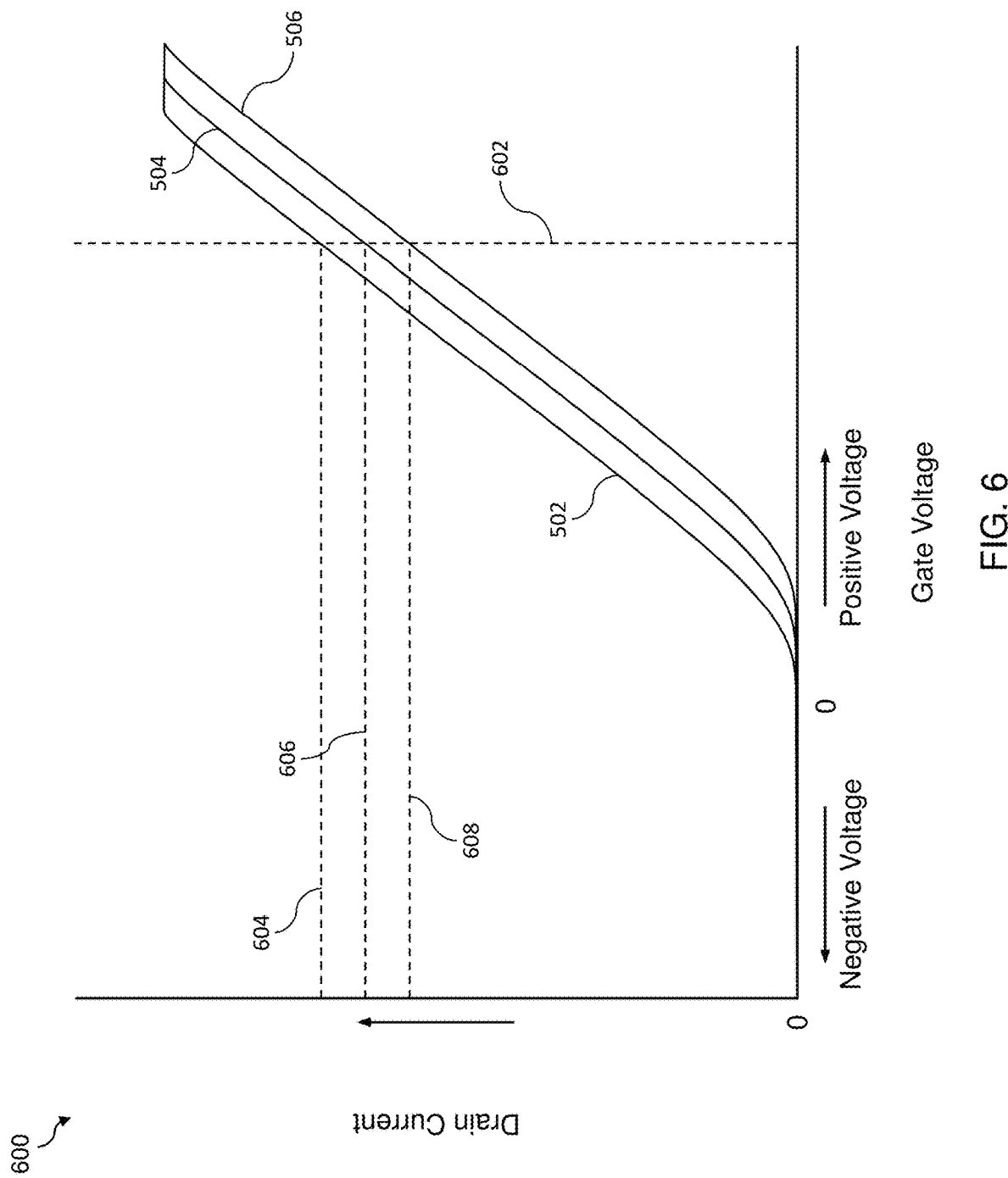
FIG. 6 is a graph diagram illustrating electric current and voltage of a TFT according to an embodiment.

FIGS. 5 and 6 illustrate example graphs 500, 600 of electric current and voltage of a TFT (e.g., TFT 100 in FIGS. 1A-2A) according to an embodiment. With reference to FIGS. 1A-6, the graphs 500, 600 illustrated in FIGS. 5 and 6 show plots 502, 504, 506 of a drain current (Id) on a vertical axis and a gate voltage (Vg) on a horizontal axis. The plots 502, 504, 506 may represent responses of a TFT to various magnitudes of applied mechanical stress. For example, the magnitude of the applied mechanical stress may be described in relative terms in relation to the applied mechanical stress represented by each of the plot 502, 504, 506. For example, the plot 502 may represent a low applied mechanical stress relative to the plots 504, 506; plot 504 may represent a middle applied mechanical stress relative to the plots 502, 506; and the plot 506 may represent a high applied mechanical stress relative to the plots 502, 504.

The graph 500 illustrated in FIG. 5, shows a consistent or set drain current level 508 and variable gate voltages 510, 512, 514 to achieve the drain current level 508. As described herein, the drain current may affect the sensing current. In some embodiments, a consistent or set drain current level 508 may correspond with or result in a consistent or set sensing current level. In some embodiments, the sensing current level may be approximately equal to the drain current level 508 a controller (e.g., controller 306 in FIGS. 3 and 4) may be configured to achieve by modifying a gate voltage. The controller may determine whether a mechanical stress is applied and/or a level of a mechanical stress applied to the TFT 100 from the gate voltage 510, 512, 514 needed to achieve the drain current level 508. A mechanical stress applied to the TFT 100 may affect the drain current output by the TFT 100. For example an organic material piezoelectric stress gate layer (e.g., organic material piezoelectric stress gate layer 108 in FIGS. 1A and 1B) of the TFT 100 may change polarization based on the applied mechanical stress. The polarization of the organic material piezoelectric stress gate layer 108 may affect characteristics, such as resistance, of a conductive channel in an amorphous semiconductor channel layer (e.g., amorphous semiconductor channel layer 110 in FIGS. 1A, 1B). The characteristics of the conductive channel may affect the drain current output by the TFT.

The mechanical stress applied to the TFT 100 may be such that for a given gate voltage, the drain current does not equal the drain current level 508. A gate voltage applied to the TFT 100, such as at a gate end (e.g., gate electrode 104 in FIGS. 1A, 1B), may further affect the characteristics of the conductive channel in the amorphous semiconductor channel layer 110. The controller may be configured to adjust the given gate voltage to a gate voltage 510, 512, 514 at which the drain current is equal to the drain current level 508. The controller may determine whether a mechanical stress is applied and/or a level of the mechanical stress applied to the TFT 100 from the gate voltage 510, 512, 514 at which the drain current is equal to the drain current level 508. In other words, the controller may determine whether a mechanical stress is applied and/or a level of the mechanical stress applied to the TFT 100 from the gate voltage 510, 512, 514 at which the sensing current is equal to the consistent or set drain sensing current level.

The graph 600 illustrated in FIG. 6, shows a consistent or set gate voltage level 602 and variable drain currents 604, 606, 608 resultant at the gate voltage level 602. As described herein, the drain current may affect the sensing current. In some embodiments, a variable drain current 604, 606, 608 may correspond with or result in a variable sensing current. In some embodiments, the sensing current may be approximately equal to the drain current. The gate voltage level 602 may be a gate voltage a controller (e.g., controller 306 in FIGS. 3 and 4) may apply to a TFT 100, such as at a gate end (e.g., gate electrode 104 in FIGS. 1A, 1B). The controller may sense the sensing currents, corresponding to the drain currents 604, 606, 608 resultant from the gate voltage level 602, and determine whether a mechanical stress is applied and/or a level of a mechanical stress applied to the TFT 100 from the sensing currents. The gate voltage level 602 applied to the TFT 100 may affect the drain current 604, 606, 608 output by the TFT 100. The gate voltage level 602 applied to the TFT 100 may affect characteristics, such as resistance, of a conductive channel in an amorphous semiconductor channel layer (e.g., amorphous semiconductor channel layer 110 in FIGS. 1A, 1B) of the TFT. The characteristics of the conductive channel may affect the drain current 604, 606, 608 output by the TFT 100. A mechanical stress applied to the TFT 100 may further affect the characteristics of the conductive channel. For example, an organic material piezoelectric stress gate layer (e.g., organic material piezoelectric stress gate layer 108 in FIGS. 1A, 1B) of the TFT 100 may change polarization based on the applied mechanical stress. The polarization of the organic material piezoelectric stress gate layer may affect characteristics of the conductive channel. The mechanical stress applied to the TFT 100 may be such that for the gate voltage level 602 the drain current 604, 606, 608 may vary. The controller may be configured to determine whether a mechanical stress is applied and/or a level of the mechanical stress applied to the TFT from the sensing currents corresponding to the drain currents 604, 606, 608 resultant from the gate voltage level 602 and/or the mechanical stress applied to the TFT 100.

Figure 7:
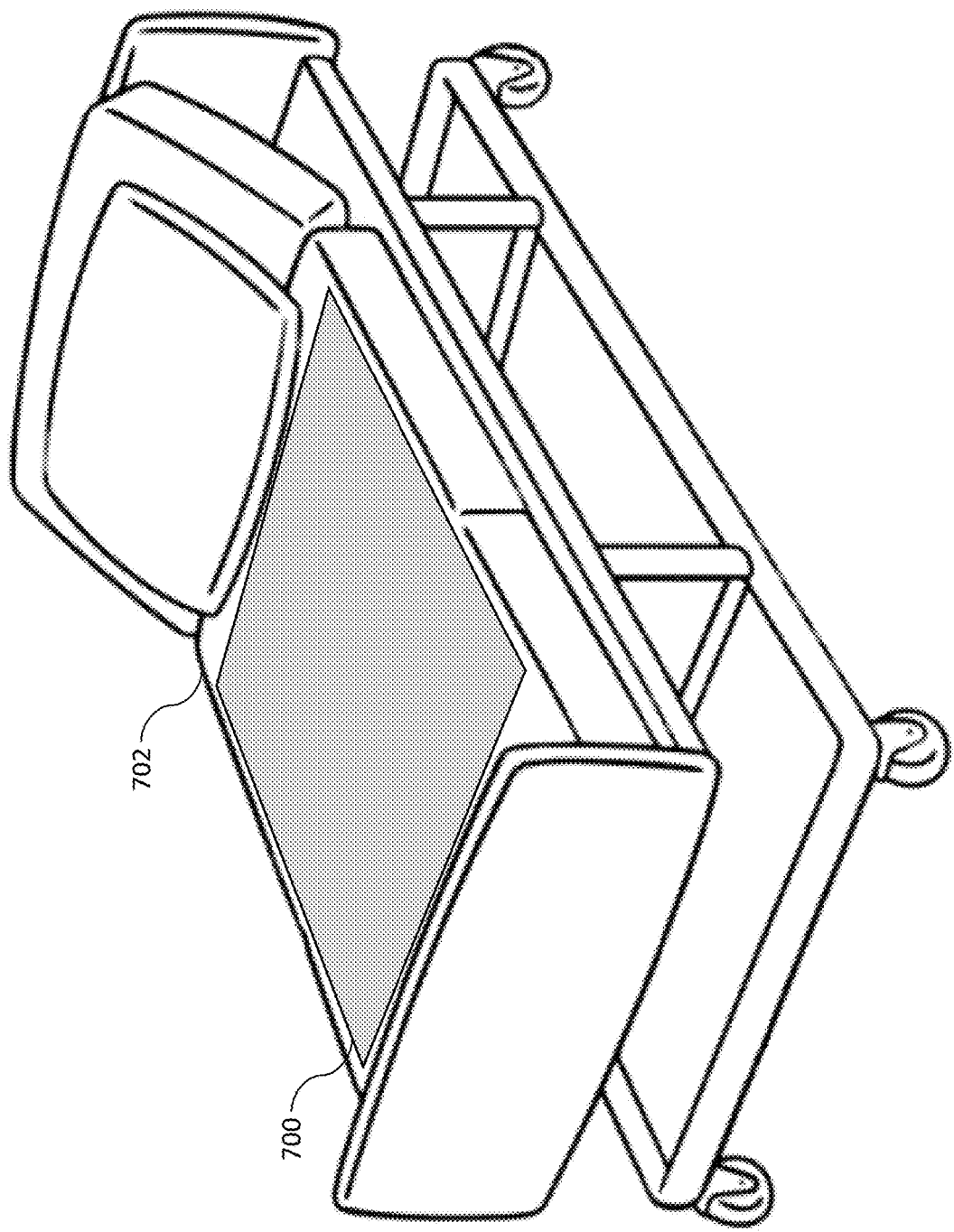
FIG. 7 is a schematic diagram illustrating a perspective view of a TFT stress sensor device suitable for implementing various embodiments.

FIG. 7 illustrates a perspective view of a TFT stress sensor device 700 (e.g., TFT stress sensor device 300 in FIG. 3, TFT stress sensor device 400 in FIG. 4) suitable for implementing various embodiments. With reference to FIGS. 1A-7, the TFT stress sensor device 700 may be a sheet (e.g., sheet 304 in FIGS. 3 and 4), such as a blanket or a polymer sheet, that may be embedded with any number and combination of TFT stress sensors (e.g., TFT stress sensor 200 in FIG. 2A, TFT stress sensor 302 in FIG. 3, TFT stress sensors 402 in FIG. 4). The TFT stress sensor device 700 may be sized to overlie at least a portion of a surface 702, such as a mattress or a cushion, and sense movement of a subject, such as a human or an animal, on top of the TFT stress sensor device 700. For example, the TFT stress sensor device 700 may be sized to overlie at least a portion of a hospital bed mattress and sense movement of a human subject lying on the TFT stress sensor device 700. The TFT stress sensor device 700 may be used for patient health care to detect and monitor the human subject's movement, which may be associated with the human subject's mobility, comfort, consciousness, vitality, etc. For example, during a human subject's sleep, the subject may be expected to turn-over 20 to 30 times per night, and sensing fewer or more movements than expected may indicate a problem with the human subject.

Figure 8:
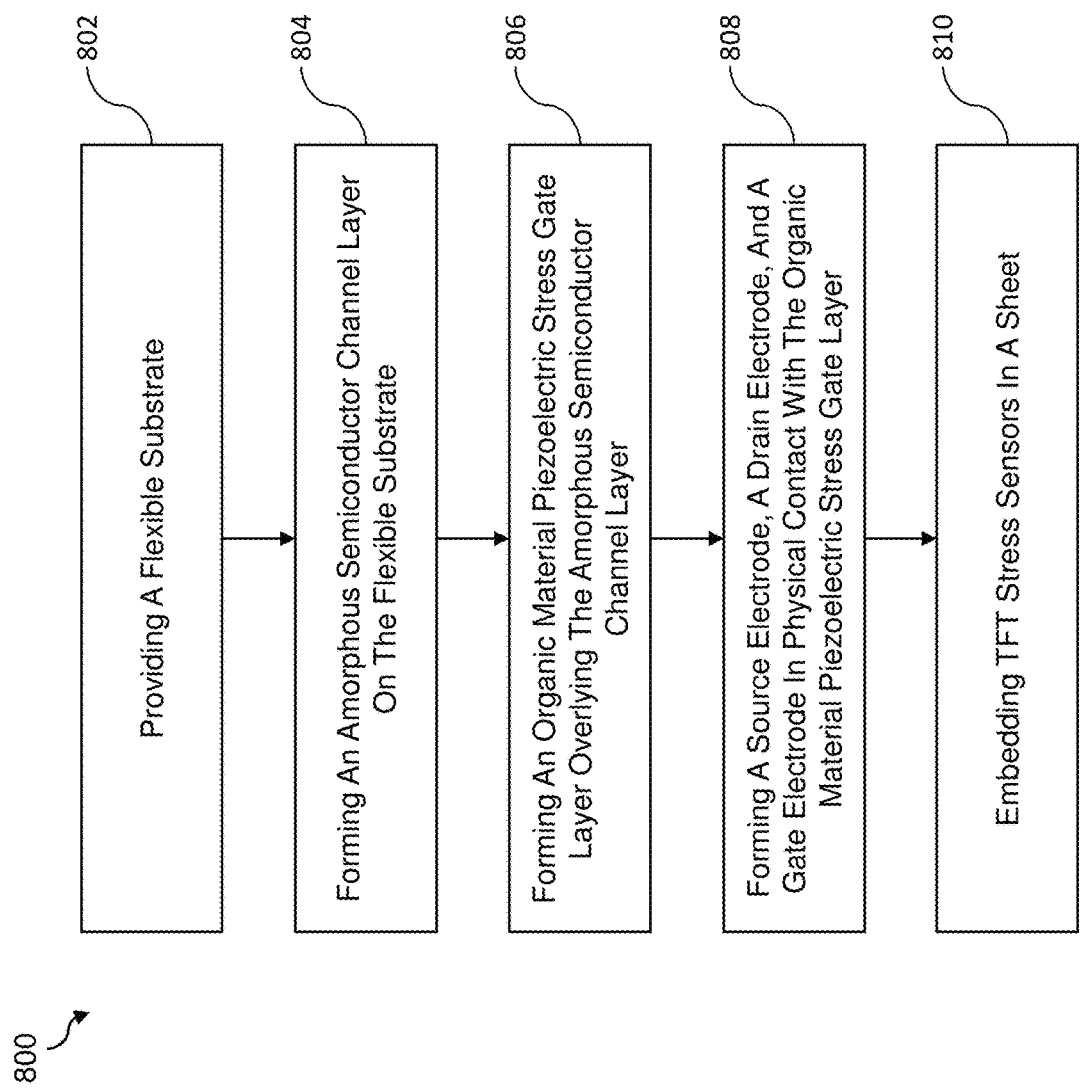
FIG. 8 is a process flow diagram illustrating a method of forming a TFT stress sensor according to an embodiment.

FIG. 8 illustrates a method 800 of forming a TFT stress sensor according to an embodiment. With reference to FIGS. 1A-8, in block 802 a flexible substrate 112 may be provided. The flexible substrate 112 may be provided as a structural component for forming a circuit of a plurality of TFTs 100. The flexible substrate 112 may be a polymer material. For example, the flexible substrate 112 may be PET, PE, PTF, PP, PVC, etc. In some embodiments, the flexible substrate 112 may be sufficiently strong, pliable, and/or elastic to approximately conform to depressions of a pliable surface (e.g., surface 702 in FIG. 7), such as a mattress or cushion, under a weight of a subject, such as a human or an animal, on top of the flexible substrate 112 and the pliable surface.

In block 804, an amorphous semiconductor channel layer 110 may be formed on the flexible substrate 112. In some embodiments, amorphous semiconductor channel layer 110 may be formed by ALD of a material of the amorphous semiconductor channel layer 110 on the flexible substrate 112. In some embodiments, amorphous semiconductor channel layer 110 may be formed by CVD of the material of the amorphous semiconductor channel layer 110 on the flexible substrate 112. The amorphous semiconductor channel layer 110 may have sufficiently large area to be the semiconductor channel layer for a plurality of TFTs 100. The material of the amorphous semiconductor channel layer 110 may be a material having greater flexibility than an Si based semiconductor channel layer. The material of the amorphous semiconductor channel layer 110 may maintain approximately uniform electron mobility and structural uniformity over large-area formations. For example, the amorphous semiconductor channel layer 110 may be a-IGZO. In some embodiments, the amorphous semiconductor channel layer 110 may be a thin film of IGZO and/or SnIGZO. In some embodiments, the amorphous semiconductor channel layer 110 may be low-temperature poly-Si and/or SiGe. In some embodiments, the amorphous semiconductor channel layer 110 may be an III-V semiconductor material and/or an II-VI semiconductor material. In some embodiments, the amorphous semiconductor channel layer 110 may be a compound semiconductor, not used for wafer level Si fabrication. The amorphous semiconductor channel layer 110 may be approximately 0.1 nm to approximately 300 nm thick, although a thicker or thinner amorphous semiconductor channel layer 110 may be used. In some embodiments the amorphous semiconductor channel layer 110 may be may be thicker than approximately 300 nm, but by being approximately 300 nm or thinner may avoid inducing a current while the TFT 100 is on an off state. Further the amorphous semiconductor channel layer 110 being approximately 300 nm or thinner may have increased flexibility, such as for withstanding curvature or bending, compared to thicker constructions, which may make the approximately 300 nm or thinner constructions more suitable for flexible TFT applications. The amorphous semiconductor channel layer 110 may have a surface area of any size, such as between approximately 1% to greater than 100% of the width of a hospital bed mattress and a length between approximately 1% to greater than 100% of the length of a hospital bed mattress, although larger or smaller surface areas may be used.

In block 806, an organic material piezoelectric stress gate layer 108 may be formed overlying the amorphous semiconductor channel layer 110. The amorphous semiconductor channel layer 110 may have sufficiently large area to be the stress gate layer for a plurality of TFTs 100. The organic material piezoelectric stress gate layer 108 may be a material having piezoelectric properties. In response to a mechanical stress, the organic material piezoelectric stress gate layer 108 may develop a piezopotential by deformation of the molecular structure of the organic material piezoelectric stress gate layer 108 causing polarization of the molecules of the organic material piezoelectric stress gate layer 108. The piezopotential may result from opposite polarization at opposite sides 114, 116 of the organic material piezoelectric stress gate layer 108. In some embodiments, the organic material piezoelectric stress gate layer 108 may be organic PVDF. In some embodiments, the organic material piezoelectric stress gate layer 108 may be organic PVDF-TrFE. In some embodiments, the organic material piezoelectric stress gate layer 108 may be HfZrO. An HfZrO organic material piezoelectric stress gate layer 108 may be approximately 0.1 nm to 100 nm thick, although other although thicker or thinner gate layers may be used. An HfZrO organic material piezoelectric stress gate layer 108 may have oxygen vacancy. An HfZrO organic material piezoelectric stress gate layer 108 may have varied Hf:Zr ratios, such that HfZrO may be $Hf_xZr_{1-x}O_y$ for which "x" may be a number from 0 to 1 and "y" may be any positive number. In some embodiments, the organic material piezoelectric stress gate layer 108 may be MN doped with Sc and/or other ferroelectric elements. In some embodiments, the organic material piezoelectric stress gate layer 108 may be $BaTiO_3$, $PbTiO_3$, and/or $Pb(ZrTi)O_3$ or PZT.

In block 808, a source electrode 102, a gate electrode 104, and a drain electrode 106 may be formed in physical contact with the organic material piezoelectric stress gate layer 108. In some embodiment the source electrode 102, the gate electrode 104, and the drain electrode 106 may be metal electrodes. In some embodiments, the source electrode 102, the gate electrode 104, and the drain electrode 106 may be formed using known methods, such as photolithography. The gate electrode 104 may be physically separated from the amorphous semiconductor channel layer 110 by the organic material piezoelectric stress gate layer 108. In some embodiments the source electrode 102 and the drain electrode 106 may be formed in physical contact with a second side 114 of the organic material piezoelectric stress gate layer 108. The organic material piezoelectric stress gate layer 108 may physically separate the source electrode 102 and the drain electrode 106 from the amorphous semiconductor channel layer 110. In some embodiments, the organic material piezoelectric stress gate layer 108 may include channels through which the source electrode 102 and the drain electrode 106 may be formed such that the source electrode 102 and the drain electrode 106 may be in physical contact with the amorphous semiconductor channel layer 110. In some embodiments, the gate electrode 104, source electrode 102 and drain electrode 106 may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable conductive materials within the contemplated scope of disclosure may also be used. The gate electrode 104, source electrode 102 and/or drain electrode 106 may be single layer or multi-layer formations. A buffer layer or blocking layer (not shown) may be formed between the any of the electrodes 102, 104, 106 and the organic material piezoelectric stress gate layer 108 and/or the amorphous semiconductor channel layer 110. The buffer layer or blocking layer materials may include $Ta_2O_5$ or $HfO_2$ doped with Si, Mg, Al, $Y_2O_3$, La, Sr, Gd, N, Sc, Ca, Ti, W, Cr, Ta, Mo, Ru, Os, epoxy, etc., or any combination compound of Si, Mg, Al, $Y_2O_3$, La, Sr, Gd, N, Sc, Ca, Ti, W, Cr, Ta, Mo, Ru, Os, etc. The buffer layer or blocking layer may have a thickness of between approximately 0.1 nm and approximately 1 nm, although thicker or thinner buffer layers or blocking layers may be used.

In various embodiments, any combination blocks 802-808 may be executed repeatedly and/or in parallel for multiple TFTs 100. In some embodiments, the multiple TFTs 100 resulting from the execution(s) of blocks 802-808 may be referred to as a TFT stress sensor 200, 302, 402.

In block 810, the TFT stress sensor 200, 302, 402 may be embedded in a sheet 304, such as a blanket or a polymer sheet. The TFT stress sensor 200, 302, 402 may be embedded in the sheet 304 by being sewn to the sheet 304, welded (e.g., via ultrasonic welding) to the sheet 304, adhered or bonded to the sheet 304, impressed into the sheet 304, encased in the sheet 304, etc.

Figure 9:
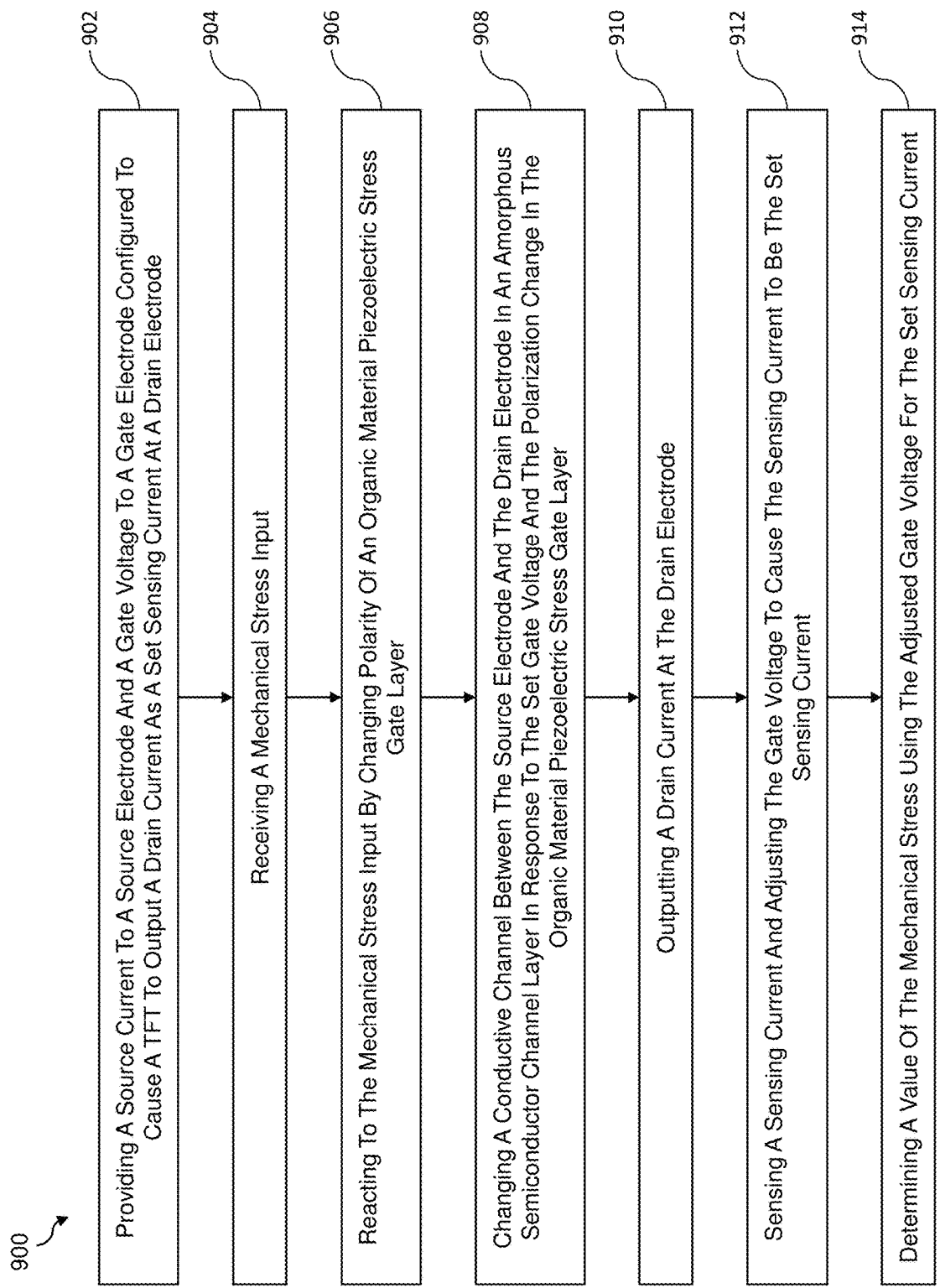
FIG. 9 is a process flow diagram illustrating a method of sensing stresses with a TFT stress sensor according to an embodiment.

FIG. 9 illustrates a method 900 of sensing stresses with a TFT stress sensor 200, 302, 402 according to an embodiment. With reference to FIGS. 1A-9, the method 900 may be implemented in hardware (e.g., TFT 100 in FIGS. 1A, 1B and 2A, a TFT stress sensor 200, 302, 402 in FIGS. 2A, 3, and 4, electric sensor 226 in FIGS. 2A and 2B, a controller 306 in FIGS. 3 and 4), in software executing in a processor (e.g., controller 306 in FIGS. 3 and 4), or in a combination of a software-configured processor and dedicated hardware (e.g., TFT stress sensor device 300, 400, 700 device in FIGS. 3, 4, and 7).

In block 902, a controller 306 may provide a source current to a source electrode 102 and a gate voltage to a gate electrode 104 configured to cause a TFT 100 to output a drain current a drain electrode 106. The controller 306 may control an electric power conditioning component, such as an AC/DC rectifier and/or a DC/DC converter to provide the source current by conditioning a current from an electric power source 224. The controller 306 may control a source transistor 212 to transmit the source current from the power electric power conditioning component to the source electrode 102. The controller 306 may control an electric power conditioning component, such as an AC/DC rectifier, a DC/AC inverter, DC/DC converter, and/or an AC/AC converter to provide the gate current by conditioning a current from the electric power source 224. In some embodiments, the controller 306 may control an oscillator 222 to provide an AC component of the gate current. A consistent or set drain current level for the drain current may correspond to a consistent or set sensing current level the controller 306 may use to determine whether a mechanical stress is applied and/or a level of the mechanical stress applied to the TFT 100.

In block 904, the TFT 100 may receive a mechanical stress input. For example, the TFT 100 may receive a pressure force from a subject, such as a human or an animal, on top of the TFT 100. For another example, a pressure force from a subject, such as a human or an animal, on top of the TFT 100 may be removed from the TFT 100, thus relieving stress.

In block 906, the TFT 100 may react to the mechanical stress input by changing polarity of an organic material piezoelectric stress gate layer 108. For example, the mechanical stress input may rearrange the molecular structure of the organic material piezoelectric stress gate layer 108 causing polarization or depolarization of the organic material piezoelectric stress gate layer 108.

In block 908, the TFT 100 may change a conductive channel between the source electrode 102 and the drain electrode 106 in an amorphous semiconductor channel layer 110 in response to the gate voltage and the polarization change in the organic material piezoelectric stress gate layer 108. The polarization of the organic material piezoelectric stress gate layer 108 may affect characteristics, such as resistance, of the conductive channel in the amorphous semiconductor channel layer 110. The gate voltage applied to the TFT 100 may further affect the characteristics of the conductive channel in the amorphous semiconductor channel layer 110. The characteristics of the conductive channel may affect the drain current output by the TFT 100. For example, reducing resistance of the conductive channel may allow for increasing the drain current. For another example, increasing the resistance of the conductive channel may allow for decreasing the drain current. In some embodiments, the TFT 100 may form the conductive channel where resistance in the amorphous semiconductor channel layer 110 did not allow electric current flow between the source electrode 102 and the drain electrode 106 and the resistance is reduced to allow electric current flow between the source electrode 102 and the drain electrode 106. In some embodiments, the TFT 100 may remove the conductive channel where resistance in the amorphous semiconductor channel layer 110 allowed electric current flow between the source electrode 102 and the drain electrode 106 and the resistance is increased to not allow electric current flow between the source electrode 102 and the drain electrode 106. In some embodiments, changes in the drain current caused by changes in the conductive channel may correspondingly cause changes in the sensing current.

In block 910, a TFT 100 may output the drain current. The TFT 100 may output a drain current at the drain electrode 106. In some embodiments, the TFT 100 may output the drain current to a capacitor 210, and the capacitor 210 may accumulate and output the drain current in turn.

In block 912, the controller 306 may sense a sensing current and adjust the gate voltage to cause the drain current to be the set drain current level. The controller may sense the sensing current from a sensing current signal received from an electric sensor 226. The controller 306 may be configured to achieve the set drain current level by modifying the gate voltage. The mechanical stress applied to the TFT may be such that for a given gate voltage, such as the gate voltage in block 902, the drain current does not equal the set drain current level. The controller 306 may be configured to adjust the given gate voltage to a gate voltage at which the drain current is equal to the set drain current level.

The corresponding relationship between the drain current and the sensing current may allow the controller to control the drain current based on the sensing current. In some embodiments, the controller 306 may be configured to achieve a set sensing current level by modifying the gate voltage. The mechanical stress applied to the TFT may be such that for a given gate voltage, such as the gate voltage in block 902, the sensing current does not equal the set drain sensing level. The controller 306 may be configured to adjust the given gate voltage to a gate voltage at which the sensing current is equal to the set sensing current level.

In some embodiments, the gate voltage may be increased incrementally until the drain current achieves the set drain current level or the sensing current achieves the set sensing current level. Blocks 908-912 may be repeatedly implemented to incrementally increase the gate voltage until the drain current achieves the set drain current level or the sensing current achieves the set sensing current level.

In block 914, the controller 306 may determine a value of the mechanical stress using the adjusted gate voltage for the set sensing current level from block 912. In some embodiments the value of the mechanical stress may be a value calculated and configured to indicate a magnitude of the mechanical stress. In some embodiments, the value of the mechanical stress may be a value configured to indicate a change in the magnitude of the mechanical stress. For example, a value of the mechanical stress may be compared to a pervious value of the mechanical stress at a TFT 100 to determine whether there is a change in the magnitude of the mechanical stress. In some embodiments, the value of the mechanical stress may be a binary value configured to indicate presence or lack of presence of a mechanical stress.

Figure 10:
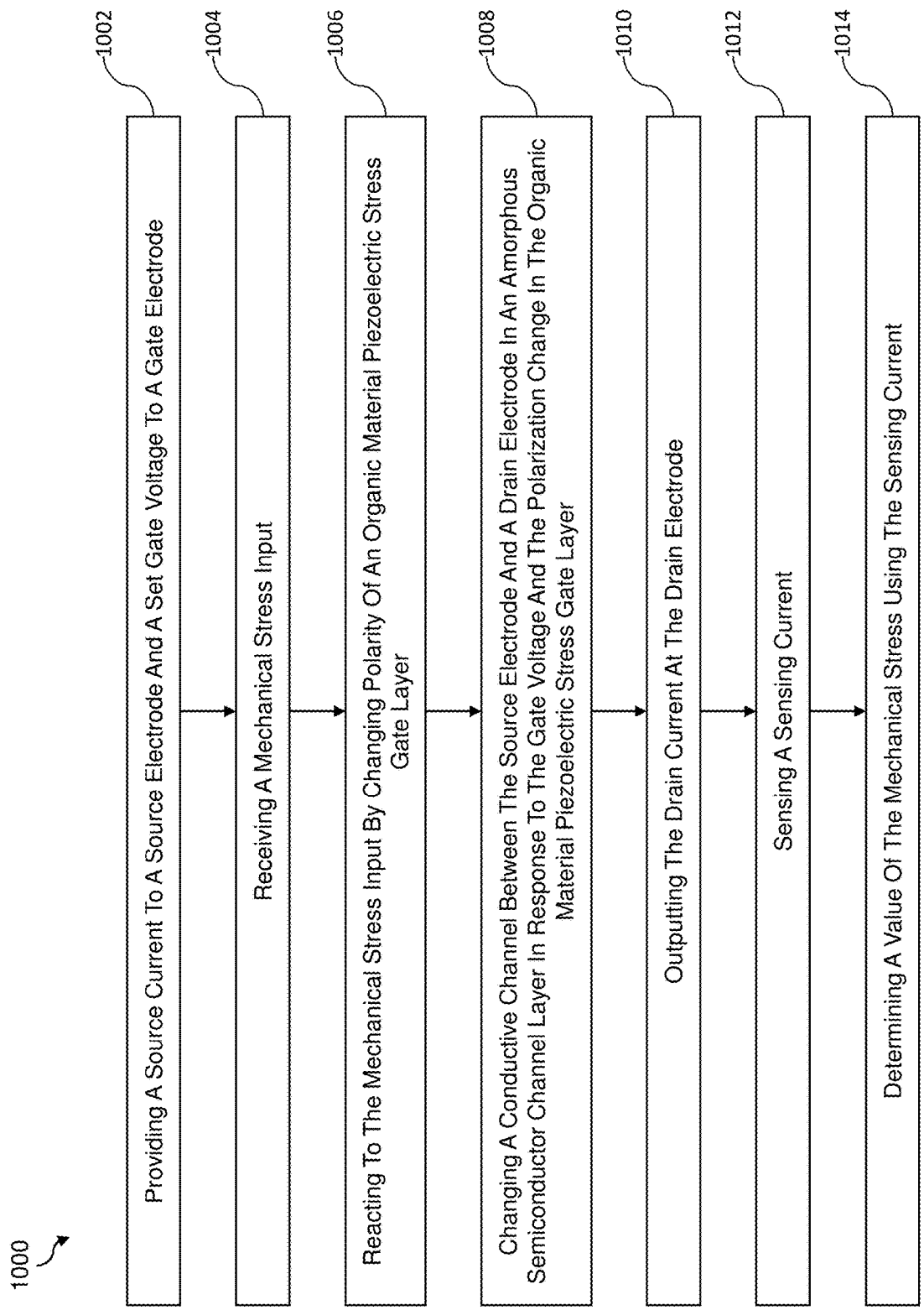
FIG. 10 is a process flow diagram illustrating a method of sensing stresses with a TFT stress sensor according to an embodiment.

FIG. 10 illustrates a method 1000 of sensing stresses with a TFT stress sensor 200, 302, 402 according to an embodiment. With reference to FIGS. 1A-10, the method 1000 may be implemented in hardware (e.g., a TFT 100 in FIGS. 1A, 1B and 2A, a TFT stress sensor 200, 302, 402 in FIGS. 2A, 3, and 4, electric sensor 226 in FIGS. 2A and 2B, a controller 306 in FIGS. 3 and 4), in software executing in a processor (e.g., controller 306 in FIGS. 3 and 4), or in a combination of a software-configured processor and dedicated hardware (e.g., TFT stress sensor device 300, 400, 700 device in FIGS. 3, 4, and 7).

In block 1002, a controller 306 may provide a source current to a source electrode 102 and a set gate voltage to a gate electrode 104 of a TFT 100. The controller 306 may control an electric power conditioning component, such as an AC/DC rectifier and/or a DC/DC converter to provide the source current by conditioning a current from an electric power source 224. The controller 306 may control a source transistor 212 to transmit the source current from the power electric power conditioning component to the source electrode 102. The controller 306 may control an electric power conditioning component, such as an AC/DC rectifier, a DC/AC inverter, DC/DC converter, and/or an AC/AC converter to provide the gate current by conditioning a current from the electric power source 224. In some embodiments, the controller 306 may control an oscillator 222 to provide an AC component of the gate current. A consistent or set gate voltage level for the set gate voltage may be used to determine whether a mechanical stress is applied and/or a level of the mechanical stress applied to the TFT 100 from a resultant drain voltage output by the TFT 100 at a drain electrode 106 or sensing voltage sensed by the controller.

In block 1004, the TFT 100 may receive a mechanical stress input. For example, the TFT 100 may receive a pressure force from a subject, such as a human or an animal, on top of the TFT 100. For another example, a pressure force from a subject, such as a human or an animal, on top of the TFT 100 may be removed from the TFT 100.

In block 1006, the TFT 100 may react to the mechanical stress input by changing polarity of an organic material piezoelectric stress gate layer 108. For example, the mechanical stress input may rearrange the molecular structure of the organic material piezoelectric stress gate layer 108 causing polarization or depolarization of the organic material piezoelectric stress gate layer 108.

In block 1008, the TFT 100 may change a conductive channel between the source electrode 102 and the drain electrode 106 in an amorphous semiconductor channel layer 110 in response to the set gate voltage and the polarization change in the organic material piezoelectric stress gate layer 108. The polarization of the organic material piezoelectric stress gate layer 108 may affect characteristics, such as resistance, of the conductive channel in the amorphous semiconductor channel layer 110. The set gate voltage applied to the TFT 100 may further affect the characteristics of the conductive channel in the amorphous semiconductor channel layer 110. The characteristics of the conductive channel may affect the drain current output by the TFT 100. For example, reducing resistance of the conductive channel may allow for increasing the drain current. For another example, increasing the resistance of the conductive channel may allow for decreasing the drain current. In some embodiments, the TFT 100 may form the conductive channel where resistance in the amorphous semiconductor channel layer 110 did not allow electric current flow between the source electrode 102 and the drain electrode 106 and the resistance is reduced to allow electric current flow between the source electrode 102 and the drain electrode 106. In some embodiments, the TFT 100 may remove the conductive channel where resistance in the amorphous semiconductor channel layer 110 allowed electric current flow between the source electrode 102 and the drain electrode 106 and the resistance is increased so as to prevent further electric current flow between the source electrode 102 and the drain electrode 106. In some embodiments, changes in the drain current caused by changes in the conductive channel may correspondingly cause changes in the sensing current.

In block 1010, the TFT 100 may output the drain current. The TFT 100 may output the drain current at the drain electrode 106. In some embodiments, the TFT 100 may output the drain current to a capacitor 210, and the capacitor 210 may accumulate and output the drain current in turn.

In block 1012, the controller 306 may sense a sensing current. The controller may sense the sensing current from a sensing current signal received from an electric sensor 226.

In block 1014, the controller 306 may determine a value of the mechanical stress using the sensing current from block 1012. In some embodiments the value of the mechanical stress may be a value calculated and configured to indicate a magnitude of the mechanical stress. In some embodiments, the value of the mechanical stress may be a value configured to indicate a change in the magnitude of the mechanical stress. For example, a value of the mechanical stress may be compared to a pervious value of the mechanical stress at a TFT 100 to determine whether there is a change in the magnitude of the mechanical stress. In some embodiments, the value of the mechanical stress may be a binary value configured to indicate presence or lack of presence of a mechanical stress.

Referring collectively to FIGS. 1A-10, an embodiment thin-film transistor 100 is provided. The thin-film transistor 100 may include: an amorphous semiconductor channel layer 110; an organic material piezoelectric stress gate layer 108 adjacent to the amorphous semiconductor channel layer 110; a source electrode 102 coupled to the organic material piezoelectric stress gate layer 108; a drain electrode 106 coupled to the organic material piezoelectric stress gate layer 108; and a gate electrode 104 coupled to the organic material piezoelectric stress gate layer 108.

In one embodiment thin-film transistor 100, the amorphous semiconductor channel layer 110 may be amorphous indium gallium zinc oxide.

In one embodiment thin-film transistor 100, the amorphous semiconductor channel layer 110 may be between approximately 0.1 nm to approximately 300 nm.

In one embodiment thin-film transistor 100, the amorphous semiconductor channel layer 110 may be at least one of a group of Indium-Gallium-Zinc-Oxide (IGZO), tin doped IGZO, low-temperature poly-silicon, silicon germanium, an III-V semiconductor material, an II-VI semiconductor material, or a compound semiconductor material not used for wafer level silicon fabrication.

In one embodiment thin-film transistor 100, the organic material piezoelectric stress gate layer 108 may be one of a group of organic polyvinylidene fluoride or organic polyvinylidene fluoride-trifluoroethylene.

In one embodiment thin-film transistor 100, the organic material piezoelectric stress gate layer 108 may be at least one of a group of hafnium oxide doped with zirconium, aluminum nitride doped with scandium, aluminum nitride doped with a ferroelectric element, barium titanate, lead titanate, or lead zirconate titanate.

In one embodiment thin-film transistor 100, the organic material piezoelectric stress gate layer 108 may be configured to selectively change a conductive channel between the source electrode 102 and the drain electrode 106 to the amorphous semiconductor channel layer 110 in response to a mechanical force.

In one embodiment thin-film transistor 100, the amorphous semiconductor channel layer 110 may be formed on a flexible substrate 112.

In one embodiment thin-film transistor 100, the flexible substrate 112 may be one of a group of polyethylene terephthalate, polyethylene, polytrimethylene furandicarboxylate, polypropylene, polyvinyl chloride, or other polymer material.

In one embodiment thin-film transistor 100 may further include a buffer layer formed adjacent to any of the source electrode, the gate electrode, or the drain electrode, and adjacent to any of the amorphous semiconductor channel layer or the organic material piezoelectric stress gate layer.

Referring collectively to FIGS. 1A-10, an embodiment thin-film transistor (TFT) stress sensor 200, 302, 402 is provided. The embodiment TFT stress sensor 200, 302, 402 may include: a flexible substrate 112; an amorphous semiconductor channel layer 110 formed on the flexible substrate 112; an organic material piezoelectric stress gate layer 108 formed adjacent to the amorphous semiconductor channel layer 110; a plurality of source electrodes coupled to the organic material piezoelectric stress gate layer 108; a plurality of drain electrodes coupled to the organic material piezoelectric stress gate layer 108; a plurality of gate electrodes coupled to the organic material piezoelectric stress gate layer 108; and a plurality of transistors, in which each transistor 100 of the plurality of transistors includes at least a portion of the amorphous semiconductor channel layer 110, at least a portion of the organic material piezoelectric stress gate layer 108, a source electrode 102 of the plurality of source electrodes, a drain electrode 106 of the plurality of drain electrodes, and a gate electrode 104 of the plurality of gate electrodes.

One embodiment TFT stress sensor 200, 302, 402 may further include: a first electrical conduit 204 coupled to a first plurality of transistors of the plurality of transistors, in which the first electrical conduit 204 is coupled to the gate electrode 104 of each transistor 100 of the first plurality of transistors; and a second electrical conduit 206 coupled to a second plurality of transistors of the plurality of transistors, in which the second electrical conduit 206 is coupled to the source electrode 102 of each transistor 100 of the second plurality of transistors.

One embodiment TFT stress sensor 200, 302, 402 may further include a third electrical conduit 208 coupled to the second plurality of transistors, in which the third electrical conduit 208 is coupled to the drain electrode 106 of each transistor 100 of the second plurality of transistors; and a plurality of capacitors each having a first end and a second end, in which each capacitor 210 of the plurality of capacitors at the first end is coupled to the drain electrode 106 of each transistor 100 of the second plurality of transistors, and in which each capacitor 210 of the plurality of capacitors at the second end is coupled to the third electrical conduit 208.

One embodiment TFT stress sensor 200, 302, 402 may further include a first transistor 100 that is a transistor 100 of the first plurality of transistors and that is a transistor 100 of the second plurality of transistors, in which the organic material piezoelectric stress gate layer 108 is configured to selectively change a conductive channel between the source electrode 102 and the drain electrode 106 of the first transistor 100 to the amorphous semiconductor channel layer 110 in response to a mechanical force; and an electric sensor 226 electrically connected to the first transistor 100 via the second electrical conduit 206 and configured to sense a sensing current at the first transistor 100, in which the first electrical conduit 204 is configured to provide a variable voltage to the gate electrode 104 of the first transistor 100 in response to the organic material piezoelectric stress gate layer 108 selectively changing the conductive channel between the source electrode 102 and the drain electrode 106 of the first transistor 100 to the amorphous semiconductor channel layer 110 in response to the mechanical force and in response to the sensing current not being a set sensing current level.

One embodiment TFT stress sensor 200, 302, 402 may further include a first transistor 100 that is a transistor 100 of the first plurality of transistors and that is a transistor 100 of the second plurality of transistors, in which: the first electrical conduit 204 is configured to provide a voltage to the gate electrode 104 of the first transistor 100; the organic material piezoelectric stress gate layer 108 is configured to selectively change a conductive channel between the source electrode 102 and the drain electrode 106 of the first transistor 100 to the amorphous semiconductor channel layer 110 in response to a mechanical force; and an electric sensor 226 electrically connected to the first transistor 100 via the second electrical conduit 206 and configured to sense a variable sensing current at the first transistor 100 in response to the organic material piezoelectric stress gate layer 108 selectively changing the conductive channel between the source electrode 102 and the drain electrode 106 of the first transistor 100 to the amorphous semiconductor channel layer 110 in response to the mechanical force.

In one embodiment TFT stress sensor 200, 302, 402, the amorphous semiconductor channel layer 110 is amorphous indium gallium zinc oxide; the organic material piezoelectric stress gate layer 108 is organic polyvinylidene fluoride; and the flexible substrate 112 comprises one of a group of polyethylene terephthalate, polyethylene, polytrimethylene furandicarboxylate, polypropylene, polyvinyl chloride, or other polymer material.

In one embodiment TFT stress sensor 200, 302, 402, the plurality of transistors are embedded in a sheet 304.

Referring collectively to FIGS. 1A-10, an embodiment method of forming a thin-film transistor (TFT) stress sensor 200, 302, 304, may include forming an amorphous semiconductor channel layer 110 on a flexible substrate 112 (804); forming an organic material piezoelectric stress gate layer 108 adjacent to the amorphous semiconductor channel layer 110 (806); and forming a plurality of source electrodes coupled to the organic material piezoelectric stress gate layer, a plurality of drain electrodes coupled to the organic material piezoelectric stress gate layer, and a plurality of gate electrodes coupled to the organic material piezoelectric stress gate layer 108 (808), in which at least a portion of the amorphous semiconductor channel layer 110, at least a portion of the organic material piezoelectric stress gate layer 108, a source electrode 102 of the plurality of source electrodes, a drain electrode 106 of the plurality of drain electrodes, and a gate electrode 104 are included in each transistor 100 of a plurality of transistors.

One embodiment method may further include embedding the plurality of transistors in a sheet 304 (810).

In one embodiment method, forming the amorphous semiconductor channel layer 110 may include forming the amorphous semiconductor channel layer 110 using amorphous indium gallium zinc oxide; and forming the organic material piezoelectric stress gate layer 108 comprises forming the organic material piezoelectric stress gate layer 108 using one of a group of organic polyvinylidene fluoride or organic polyvinylidene fluoride-trifluoroethylene.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, processes, circuits, and algorithm steps described in connection with the examples disclosed herein may be implemented as electronic hardware, computer software, or combinations of both. To clearly illustrate this interchangeability of hardware and software, various illustrative components, blocks, processes, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The preceding description of the disclosed examples is provided to enable any person skilled in the art to make or use the present invention. Various modifications to these examples will be readily apparent to those skilled in the art, and the generic principles defined herein may be applied to other examples without departing from the spirit or scope of the invention. Thus, the present invention is not intended to be limited to the examples shown herein but is to be accorded the widest scope consistent with the following claims and the principles and novel features disclosed herein.

As described herein, one skilled in the art will realize that examples of dimensions are approximate values and may vary by +/−5.0%, as required by manufacturing, fabrication, and design tolerances.

Various embodiments and examples are described herein in terms of electric voltage or electric current. One skilled in the art will realize that such embodiments and examples may be similarly implemented in terms of either electric voltage or electric current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thin-film transistor, comprising:
   an amorphous semiconductor channel layer;
   an organic material piezoelectric stress gate layer formed adjacent to the amorphous semiconductor channel layer;
   a source electrode coupled to the organic material piezoelectric stress gate layer;
   a drain electrode coupled to the organic material piezoelectric stress gate layer;
   a gate electrode coupled to the organic material piezoelectric stress gate layer; and
   a buffer layer formed adjacent to any of the source electrode, the gate electrode, or the drain electrode, and adjacent to any of the amorphous semiconductor channel layer or the organic material piezoelectric stress gate layer.

2. The thin-film transistor of claim 1, wherein the amorphous semiconductor channel layer is amorphous indium gallium zinc oxide.

3. The thin-film transistor of claim 1, wherein the amorphous semiconductor channel layer is between approximately 0.1 nm to approximately 300 nm.

4. The thin-film transistor of claim 1, wherein the amorphous semiconductor channel layer comprises at least one of a group of Indium-Gallium-Zinc-Oxide (IGZO), tin doped IGZO, low-temperature poly-silicon, silicon germanium, an III-V semiconductor material, an II-VI semiconductor material, or a compound semiconductor material not used for wafer level silicon fabrication.

5. The thin-film transistor of claim 1, wherein the organic material piezoelectric stress gate layer comprises one of a group of organic polyvinylidene fluoride or organic polyvinylidene fluoride-trifluoroethylene.

6. The thin-film transistor of claim 1, wherein the organic material piezoelectric stress gate layer comprises at least one of a group of hafnium oxide doped with zirconium, aluminum nitride doped with scandium, aluminum nitride doped with a ferroelectric element, barium titanate, lead titanate, or lead zirconate titanate.

7. The thin-film transistor of claim 1, wherein the organic material piezoelectric stress gate layer is configured to vary the conductivity of a conductive channel between the source electrode and the drain electrode to the amorphous semiconductor channel layer in response to a mechanical force.

8. The thin-film transistor of claim 1, wherein the amorphous semiconductor channel layer is formed on a flexible substrate.

9. The thin-film transistor of claim 8, wherein the flexible substrate comprises one of a group of polyethylene terephthalate, polyethylene, polytrimethylene furandicarboxylate, polypropylene, polyvinyl chloride, or other polymer material.

10. The thin-film transistor of claim 1, wherein the source electrode and the drain electrode are formed in the organic material piezoelectric stress gate layer such that the source electrode and the drain electrode are in physical contact with the amorphous semiconductor channel layer.

11. A thin-film transistor (TFT) stress sensor, comprising:
    a flexible substrate;
    an amorphous semiconductor channel layer formed on the flexible substrate;
    an organic material piezoelectric stress gate layer formed adjacent to the amorphous semiconductor channel layer;
    a plurality of source electrodes coupled to the organic material piezoelectric stress gate layer;
    a plurality of drain electrodes coupled to the organic material piezoelectric stress gate layer;
    a plurality of gate electrodes coupled to the organic material piezoelectric stress gate layer; and
    a plurality of transistors, wherein each transistor of the plurality of transistors includes at least a portion of the amorphous semiconductor channel layer, at least a portion of the organic material piezoelectric stress gate layer, a source electrode of the plurality of source electrodes, a drain electrode of the plurality of drain electrodes, and a gate electrode of the plurality of gate electrodes.

12. The TFT stress sensor of claim 11, further comprising:
    a first electrical conduit coupled to a first plurality of transistors of the plurality of transistors, wherein the first electrical conduit is coupled to the gate electrode of each transistor of the first plurality of transistors; and
    a second electrical conduit coupled to a second plurality of transistors of the plurality of transistors, wherein the second electrical conduit is coupled to the source electrode of each transistor of the second plurality of transistors.

13. The TFT stress sensor of claim 12, further comprising:
    a third electrical conduit coupled to the second plurality of transistors, wherein the third electrical conduit is coupled to the drain electrode of each transistor of the second plurality of transistors; and
    a plurality of capacitors each having a first end and a second end, wherein each capacitor of the plurality of capacitors at the first end is coupled to the drain electrode of each transistor of the second plurality of transistors, and wherein each capacitor of the plurality of capacitors at the second end is coupled to the third electrical conduit.

14. The TFT stress sensor of claim 12, further comprising:
    a first transistor that is a transistor of the first plurality of transistors and that is a transistor of the second plurality of transistors,
       wherein the organic material piezoelectric stress gate layer is configured to selectively change a conductive channel between the source electrode and the drain electrode of the first transistor to the amorphous semiconductor channel layer in response to a mechanical force; and an electric sensor electrically connected to the first transistor via the second electrical conduit and configured to sense a sensing current at the first transistor,
wherein the first electrical conduit is configured to provide a variable voltage to the gate electrode of the first transistor in response to the organic material piezoelectric stress gate layer selectively changing the conductive channel between the source electrode and the drain electrode of the first transistor to the amorphous semiconductor channel layer in response to the mechanical force and in response to the sensing current not being a set sensing current level.

15. The TFT stress sensor of claim 12, further comprising a first transistor that is a transistor of the first plurality of transistors and that is a transistor of the second plurality of transistors, wherein:
the first electrical conduit is configured to provide a voltage to the gate electrode of the first transistor;
the organic material piezoelectric stress gate layer is configured to selectively change a conductive channel between the source electrode and the drain electrode of the first transistor to the amorphous semiconductor channel layer in response to a mechanical force; and
an electric sensor electrically connected to the first transistor via the second electrical conduit and configured to sense a variable sensing current at the first transistor in response to the organic material piezoelectric stress gate layer selectively changing the conductive channel between the source electrode and the drain electrode of the first transistor to the amorphous semiconductor channel layer in response to the mechanical force.

16. The TFT stress sensor of claim 11, wherein:
the amorphous semiconductor channel layer is amorphous indium gallium zinc oxide;
the organic material piezoelectric stress gate layer is organic polyvinylidene fluoride; and
the flexible substrate comprises one of a group of polyethylene terephthalate, polyethylene, polytrimethylene furandicarboxylate, polypropylene, polyvinyl chloride, or other polymer material.

17. The TFT stress sensor of claim 11, wherein the plurality of transistors are embedded in a sheet.

18. A method of forming a thin-film transistor (TFT) stress sensor, comprising:
forming an amorphous semiconductor channel layer on a flexible substrate;
forming an organic material piezoelectric stress gate layer adjacent to the amorphous semiconductor channel layer;
forming a plurality of source electrodes coupled to the organic material piezoelectric stress gate layer, a plurality of drain electrodes coupled to the organic material piezoelectric stress gate layer, and a plurality of gate electrodes coupled to the organic material piezoelectric stress gate layer,
wherein at least a portion of the amorphous semiconductor channel layer, at least a portion of the organic material piezoelectric stress gate layer, a source electrode of the plurality of source electrodes, a drain electrode of the plurality of drain electrodes, and a gate electrode are included in each transistor of a plurality of transistors.

19. The method of claim 18, further comprising embedding the plurality of transistors in a sheet.

20. The method of claim 18, wherein:
forming the amorphous semiconductor channel layer comprises forming the amorphous semiconductor channel layer on using amorphous indium gallium zinc oxide; and
forming the organic material piezoelectric stress gate layer comprises forming the organic material piezoelectric stress gate layer using one of a group of organic polyvinylidene fluoride or organic polyvinylidene fluoride-trifluoroethylene.

* * * * *